US012677091B2

(12) United States Patent
Hsieh et al.

(10) Patent No.: US 12,677,091 B2
(45) Date of Patent: Jul. 7, 2026

(54) DISPLAY MODULE AND DISPLAY APPARATUS

(71) Applicant: BOE TECHNOLOGY GROUP CO., LTD., Beijing (CN)

(72) Inventors: Mingche Hsieh, Beijing (CN); Song Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 234 days.

(21) Appl. No.: 18/577,929

(22) PCT Filed: Mar. 23, 2023

(86) PCT No.: PCT/CN2023/083484
§ 371 (c)(1),
(2) Date: Jan. 9, 2024

(87) PCT Pub. No.: WO2024/001336
PCT Pub. Date: Jan. 4, 2024

(65) Prior Publication Data
US 2024/0323590 A1     Sep. 26, 2024

(30) Foreign Application Priority Data

Jun. 30, 2022     (CN) .......................... 202210764208.5

(51) Int. Cl.
*H04R 1/28*          (2006.01)
*H04R 1/02*          (2006.01)
(Continued)

(52) U.S. Cl.
CPC ........... *H04R 1/2811* (2013.01); *H04R 1/028* (2013.01); *H10K 59/80* (2023.02);
(Continued)

(58) Field of Classification Search
CPC .. H04R 1/2811; H04R 1/028; H04R 2400/11; H04R 2499/15; H04R 7/10; H04R 19/02;
(Continued)

(56) References Cited

U.S. PATENT DOCUMENTS 10,152,130 B2 * 12/2018 Kuo ....................... G06F 3/0416
10,452,106 B2 * 10/2019 Cho ....................... G06F 1/1656
(Continued)

FOREIGN PATENT DOCUMENTS

| CN | 113053990 A | 6/2021 |
| CN | 113891232 A | 1/2022 |
| CN | 217985403 U | 12/2022 |

*Primary Examiner* — Oyesola C Ojo
(74) *Attorney, Agent, or Firm* — The Webb Law Firm

(57)          ABSTRACT

A display module includes a flexible display panel, a base layer and a sound wave driving structure. The panel includes at least one bending area and at least two non-bending areas. The base layer is on a non-display side of the panel. The sound wave driving structure is between the panel and the base layer, and includes a first electrode layer and a second electrode layer, the first electrode layer is closer to the panel than the second electrode layer, and the first electrode layer and the second electrode layer have a gap therebetween. An orthographic projection of at least one of the first electrode layer and the second electrode layer on the panel is non-overlapping with the bending area; and/or the sound wave driving structure further includes an insulating spacing layer, and an orthographic projection of the insulating spacing layer on the panel is in the bending area.

19 Claims, 17 Drawing Sheets

(51) Int. Cl.
 *H10K 59/80* (2023.01)
 *H10K 102/00* (2023.01)

(52) U.S. Cl.
 CPC ...... *H04R 2400/11* (2013.01); *H04R 2499/15* (2013.01); *H10K 2102/311* (2023.02)

(58) Field of Classification Search
 CPC ........ H04R 7/045; H04R 17/00; H10K 59/80; H10K 2102/311; H10K 59/131; H10K 59/179; H10K 59/751; H10K 59/871; H10K 59/90; G09F 9/301; G09F 9/30
 See application file for complete search history.

(56) References Cited

U.S. PATENT DOCUMENTS

| | | | |
|---|---|---|---|
| 11,343,600 | B2 | 5/2022 | Park et al. |
| 11,544,957 | B2 * | 1/2023 | Ryu ........................... G06T 7/11 |
| 12,422,895 | B2 * | 9/2025 | An ......................... H04M 1/026 |
| 2018/0035208 | A1 * | 2/2018 | Choi ...................... H04R 1/028 |
| 2020/0314513 | A1 * | 10/2020 | Park ....................... H04R 1/025 |
| 2021/0120324 | A1 * | 4/2021 | Seo ........................ H10K 59/12 |

* cited by examiner

C-C

100

A-A

100

A-A

1

DISPLAY MODULE AND DISPLAY APPARATUS

CROSS-REFERENCE TO RELATED APPLICATIONS

This application the United States national phase of International Application No. PCT/CN2023/083484, filed Mar. 23, 2023, and claims priority to Chinese Patent Application No. 202210764208.5, filed Jun. 30, 2022, the disclosures of which are hereby incorporated by reference in their entireties.

BACKGROUND OF THE INVENTION

Field of the Invention

The present disclosure relates to the field of display technologies, and in particular, to a display module and a display apparatus.

Description of Related Art

Screen-directional sound generation means that a sound wave driving structure in a display apparatus drives a flexible display panel to vibrate to generate ultrasonic waves, and the ultrasonic waves undergo self-demodulation in air to produce audible sound. That is, a vibration unit in the display apparatus drives the flexible display panel to emit sound, and the sound emitted can be transmitted to human ears.

SUMMARY OF THE INVENTION

In an aspect, a display module is provided. The display module includes a flexible display panel, a base layer and a sound wave driving structure. The flexible display panel includes at least one bending area and at least two non-bending areas, and two adjacent non-bending areas are connected by a bending area. The base layer is provided on a non-display side of the flexible display panel. The sound wave driving structure is provided between the flexible display panel and the base layer, and includes a first electrode layer and a second electrode layer, the first electrode layer is closer to the flexible display panel than the second electrode layer, and the first electrode layer and the second electrode layer have a gap therebetween. An orthographic projection of at least one of the first electrode layer and the second electrode layer on the flexible display panel is non-overlapping with the bending area; and/or the display module further includes an insulating spacing layer, and an orthographic projection of the insulating spacing layer on the flexible display panel is located in the bending area.

In some embodiments, the first electrode layer includes at least two first electrodes, each first electrode is located in a non-bending area; and/or the second electrode layer includes at least two second electrodes, and each second electrode is located in a non-bending area.

In some embodiments, in a case where the first electrode layer includes the at least two first electrodes, the sound wave driving structure further includes a first connection line, and the first connection line is provided on the flexible display panel and electrically connected to the at least two first electrodes; in a case where the second electrode layer includes the at least two second electrodes, the sound wave driving structure further includes a second connection line, and the second connection line is provided on the base layer and electrically connected to the at least two second electrodes.

In some embodiments, in a case where the first electrode layer includes the at least two first electrodes, the sound wave driving structure further includes two first connection lines, the two first connection lines are respectively provided on both sides of the first electrode layer in a first direction, and the first connection lines extend along a second direction and electrically connected to edges of the at least two first electrodes extending along the second direction. In a case where the second electrode layer includes the at least two second electrodes, the sound wave driving structure further includes two second connection lines, the two second connection lines are respectively provided on both sides of the second electrode layer in the first direction, and the second connection lines extend along the second direction and electrically connected to edges of the at least two second electrodes extending along the second direction. The second direction is a direction in which the two adjacent non-bending areas are arranged, and the first direction is perpendicular to the second direction.

In some embodiments, the sound wave driving structure further includes a first bonding electrode, a second bonding electrode and a third bonding electrode. The first bonding electrode is provided on the flexible display panel, provided on a side of the first electrode layer in a second direction, and electrically connected to the first electrode layer. The second bonding electrode and the third bonding electrode are provided on the base layer and provided on a side of the second electrode layer in the second direction, the second bonding electrode is electrically connected to the second electrode layer, and the third bonding electrode is electrically connected to the first bonding electrode. The second direction is a direction in which the two adjacent non-bending areas are arranged.

In some embodiments, the sound wave driving structure further includes a first connection line, the first bonding electrode is electrically connected to the first electrode layer through the first connection line; and/or the sound wave driving structure further includes a second connection line, the second bonding electrode is electrically connected to the second electrode layer through the second connection line.

In some embodiments, the sound wave driving structure further includes two second connection lines, the sound wave driving structure includes two second bonding electrodes, and the two second bonding electrodes are respectively provided on both sides of the third bonding electrode in a first direction, and electrically connected to the two second connection lines respectively; and the first direction is perpendicular to the second direction.

In some embodiments, the sound wave driving structure further includes the insulating spacing layer. In a case where an orthographic projection of each of the first electrode layer and the second electrode layer on the flexible display panel covers the bending area, a surface of the insulating spacing layer proximate to the flexible display panel is in contact with the first electrode layer, and a surface of the insulating spacing layer proximate to the base layer is in contact with the second electrode layer; in a case where the orthographic projection of each of the first electrode layer and the second electrode layer on the flexible display panel is non-overlapping with the bending area, the surface of the insulating spacing layer proximate to the flexible display panel is flush with a surface of the first electrode layer proximate to the flexible display panel, and the surface of the insulating spacing layer proximate to the base layer is flush with a surface of the second electrode layer proximate to the flexible display panel; in a case where an orthographic projection of the first electrode layer on the flexible display panel is non-overlapping with the bending area, and an orthographic projection of the second electrode layer on the flexible display panel covers the bending area, the surface of the insulating spacing layer proximate to the flexible display panel is flush with the surface of the first electrode layer proximate to the flexible display panel, and the surface of the insulating spacing layer proximate to the base layer is in contact with the second electrode layer; in a case where the orthographic projection of the second electrode layer on the flexible display panel is non-overlapping with the bending area, and the orthographic projection of the first electrode layer on the flexible display panel covers the bending area, the surface of the insulating spacing layer proximate to the flexible display panel is in contact with the first electrode layer, and the surface of the insulating spacing layer proximate to the base layer is flush with the surface of the second electrode layer proximate to the flexible display panel.

In some embodiments, the sound wave driving structure further includes a mold frame. The mold frame is arranged around a peripheral of the first electrode layer and the second electrode layer, and forms a vibration cavity with the flexible display panel and the base layer. In a case where the sound wave driving structure includes the insulating spacing layer, the insulating spacing layer is made of a same material as the mold frame and arranged in a same layer as the mold frame; and the insulating spacing layer separates the vibration cavity to form at least two sub-cavities.

In some embodiments, a surface of the mold frame proximate to the flexible display panel is flush with a surface of the insulating spacing layer proximate to the flexible display panel, and a surface of the mold frame proximate to the base layer is flush with a surface of the insulating spacing layer proximate to the base layer.

In some embodiments, in a case where a surface of the insulating spacing layer proximate to the flexible display panel is flush with a surface of the first electrode layer proximate to the flexible display panel, the mold frame is arranged around outside of the first electrode layer; in a case where the surface of the insulating spacing layer proximate to the flexible display panel is in contact with the first electrode layer, an orthographic projection of the mold frame on the flexible display panel is located within a range of an orthographic projection of the first electrode layer on the flexible display panel, and the surface of the mold frame proximate to the flexible display panel is in contact with the first electrode layer; in a case where a surface of the insulating spacing layer proximate to the base layer is flush with a surface of the second electrode layer proximate to the base layer, the mold frame is arranged around outside of the second electrode layer; in a case where the surface of the insulating spacing layer proximate to the base layer is in contact with the second electrode layer, the orthographic projection of the mold frame on the flexible display panel is located within a range of an orthographic projection of the second electrode layer on the flexible display panel, and the surface of the mold frame proximate to the base layer is in contact with the second electrode layer.

In some embodiments, the mold frame includes a plurality of mold strips, and two adjacent mold strips have a first gap therebetween to enable the vibration cavity to communicate with outside environment.

In some embodiments, at a corner of the non-bending area away from the bending area, the two adjacent mold strips have the first gap therebetween. One of the two adjacent mold strips includes a body portion and a first protruding portion; the body portion extends along the peripheral of the first electrode layer and the second electrode layer; one end of the first protruding portion is connected to the body portion, and an other end extends into the vibration cavity; and the first protruding portion is arranged opposite to the first gap.

In some embodiments, an other of the two adjacent mold strips extends along the peripheral of the first electrode layer and the second electrode layer, and an extending direction of at least a part of the first protruding portion is parallel to an extending direction of the other mold strip.

In some embodiments, the sound wave driving structure includes the insulating spacing layer. The insulating spacing layer includes an opening penetrating through the insulating spacing layer along a second direction, and the opening communicates the at least two sub-cavities on both sides of the insulating spacing layer; and the second direction is a direction in which the two adjacent non-bending areas are arranged.

In some embodiments, the insulating spacing layer includes a plurality of openings, and the plurality of openings cut off the insulating spacing layer to form a plurality of insulating blocks spaced apart along a first direction; and the first direction is perpendicular to the second direction.

In some embodiments, an orthographic projection of the mold frame on the flexible display panel is non-overlapping with the bending area, and the insulating spacing layer and the mold frame have a second gap therebetween. The insulating spacing layer further includes a second protruding portion, and the second protruding portion is arranged opposite to the second gap.

In some embodiments, the base layer includes a buffer layer and a support layer stacked in a direction perpendicular to the flexible display panel and away from the flexible display panel. The display module further includes a back film. The back film is provided between the sound wave driving structure and the flexible display panel, the first electrode layer being provided on a surface of the back film, and the second electrode layer being provided on a surface of the buffer layer; or the back film is provided between the sound wave driving structure and the base layer, the first electrode layer being provided on the non-display side of the flexible display panel, and the second electrode layer being provided on the surface of the back film.

In some embodiments, the sound wave driving structure further includes a plurality of support columns. The plurality of support columns are provided between the first electrode layer and the second electrode layer, and an orthographic projection of the plurality of support columns on the flexible display panel is non-overlapping with the bending area.

In an aspect, a display apparatus is provided. The display apparatus includes the display module according to any one of the above embodiments.

BRIEF DESCRIPTION OF THE DRAWINGS

In order to describe technical solutions in some embodiments of the present disclosure more clearly, the accompanying drawings to be used in some embodiments of the present disclosure will be introduced briefly; obviously, the accompanying drawings to be described below are merely some embodiments of the present disclosure, and a person of ordinary skill in the art can obtain other drawings according to those drawings. In addition, accompanying drawings in the following description may be regarded as schematic diagrams, and are not limitations on an actual size of a product, an actual process of a method and an actual timing of signals involved in the embodiments of the present disclosure.

DESCRIPTION OF THE INVENTION

Figure 1:
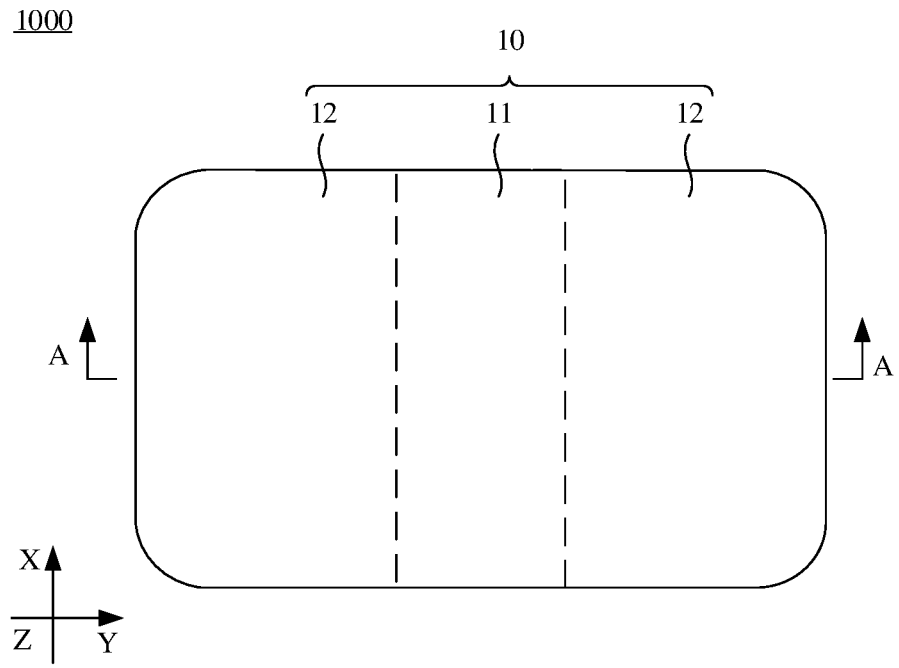
FIG. 1 is a structural diagram of a display apparatus in some embodiments of the present disclosure.

The technical solutions in some embodiments of the present disclosure will be described clearly and completely with reference to the accompanying drawings; obviously, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to. In the description of the specification, the terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled," "connected," and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact.

The phrase "A and/or B" includes the following three combinations: only A, only B, and a combination of A and B.

The use of the phrase "configured to" herein means an open and inclusive expression, which does not exclude devices that are configured to perform additional tasks or steps.

The term such as "about," "substantially," and "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as "parallel," "perpendicular," or "equal" as used herein includes a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., the limitations of a measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus 1000. For example, the display apparatus 1000 may be any product or component having a display function, such as a notebook computer, a tablet computer, a mobile phone, a personal digital assistant (PDA), a navigator, a wearable apparatus, an augmented reality (AR) apparatus, or a virtual reality (VR) apparatus.

The display apparatus 1000 may be an electroluminescence display apparatus or a photoluminescence display apparatus. In a case where the display apparatus 1000 is an electroluminescent display apparatus, the electroluminescent display apparatus may be an organic electroluminescent diode display apparatus (organic light-emitting diode (OLED) display apparatus), or a quantum dot electroluminescent diode display apparatus (quantum dot light-emitting diode (QLED) display apparatus). The OLED display apparatus may be an active matrix organic light-emitting diode (AMOLED) display apparatus.

Figure 2:
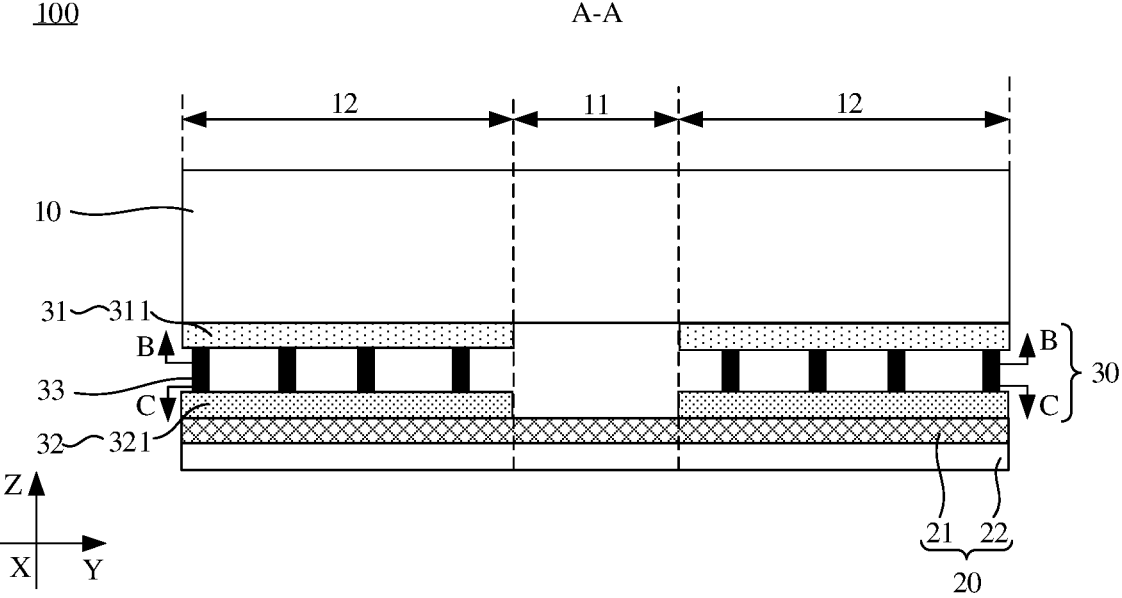
FIG. 2 is a sectional view taken along the section line A-A in FIG. 1.

In some embodiments, the display apparatus 1000 includes a display module 100. As shown in FIG. 2, the display module 100 includes a flexible display panel 10, a base layer 20 and a sound wave driving structure 30.

The flexible display panel 10 may be a foldable flexible organic light-emitting diode display panel. Alternatively, in some other embodiments, the flexible display panel 10 may be a foldable Micro LED flexible display panel, where the Micro LED is an LED whose LED chip has a size of less than 50 μm, or may be a foldable Mini LED flexible display panel, where a Mini LED is an LED whose LED chip has a size of 50 μm to 200 μm. The present disclosure does not limit the type of the flexible display panel 10. Hereinafter, for ease of illustration, embodiments of the present disclosure are illustrated by the example of the flexible display panel 10 being an OLED flexible display panel.

The flexible display panel 10 includes at least one bending area 11 and at least two non-bending areas 12. For example, as shown in FIG. 1, the flexible display panel 10 may include one bending area 11 and two non-bending areas 12. The bending area 11 extends along a first direction X, and the two non-bending areas 12 are respectively provided on both sides of the bending area 11 along a second direction Y. The second direction Y is a direction in which two adjacent non-bending areas 12 are arranged.

Two adjacent non-bending areas 12 are connected by a bending area 11. That is, at least two non-bending areas 12 are arranged spaced apart along the second direction Y, and any two adjacent non-bending areas 12 are connected by a bending area 11. The first direction X and the second direction Y are perpendicular to each other. The term "perpendicular" includes absolute perpendicularity and approximate perpendicularity, and an acceptable range of deviation of the approximate perpendicularity may also be, for example, a deviation within 5°.

During a bending (curling or folding) process of the flexible display panel 10, the bending area 11 is bent, and the non-bending area 12 remains in a flat state. It can be understood that the bending area 11 and the non-bending area 12 are demarcated based on whether deformation occurs during the bending process of the display apparatus 1000, and the structures of the two may be the same.

For example, in a process for manufacturing the flexible display panel 10, an array substrate, light-emitting devices and an encapsulation structure are formed on the same substrate in sequence, such as on a flexible substrate made of resin material. Then, the flexible display panel 10 is divided into a first area and second areas provided on both sides of the first area. A portion of the substrate, a portion of the array substrate, light-emitting devices and a portion of the encapsulation structure included in the first area constitute the bending area 11; and another portion of the substrate, another portion of the array substrate, light-emitting devices and another portion of the encapsulation structure included in the second areas constitute the non-bending areas 12.

As can be seen from the above, the bending area 11 and the non-bending area 12 may be structurally the same. However, states of the two are different when the flexible display panel 10 is bent. For example, during the bending process of the flexible display panel 10, the bending area 11 will be bent accordingly, and the non-bending area 12 remains in its original state (in the flat state).

For example, as shown in FIG. 1, the flexible display panel 10 includes one bending area 11 and two non-bending areas 12. The two non-bending areas 12 may be arranged symmetrically with respect to the bending area 11, so that ends of the two non-bending areas 12 away from the bending area 11 are flush with each other after the flexible display panel 10 is bent.

As shown in FIG. 2, the flexible display panel 10 has a light-exit surface for displaying image information (the upper surface of the flexible display panel 10 in FIG. 2). A side proximate to the light-exit surface of the flexible display panel 10 is a display side of the flexible display panel 10 (the upper side of the flexible display panel 10 in FIG. 2), and a side away from the light-exit surface of the flexible display panel 10 is a non-display side (the lower side of the flexible display panel 10 in FIG. 2).

Referring to FIG. 2, a base layer 20 is provided on the non-display side of the flexible display panel 10, and the base layer 20 is configured to support and protect the flexible display panel 10.

In some embodiments, as shown in FIG. 2, the base layer 20 may include a buffer layer 21 and a support layer 22 stacked in a direction perpendicular to the flexible display panel 10 and away from the flexible display panel 10 (the direction from top to bottom in FIG. 2).

For example, the buffer layer 21 is configured to provide a buffering effect on the flexible display panel 10, so as to reduce the stress of the flexible display panel 10 due to collision or shaking, and reduce the risk of damage to the flexible display panel 10. For example, the buffer layer 21 may include one or more of foam (Foam), polyimide (PI), polyethylene terephthalate (PET), thermoplastic polyurethane (TPU), cycloolefin polymer (COP) and triacetate (TAC).

The support layer 22 is configured to provide support to the flexible display panel 10, so that the flexible display panel 10 can have a certain rigidity to reduce unexpected deformation of the flexible display panel 10. For example, the material of the support layer 22 may be metal, such as stainless steel or titanium alloy, which are not enumerated one by one in the embodiments of the present disclosure. Alternatively, the material of the support layer 22 may also be non-metal, such as plastic, glass fiber composite material or carbon fiber composite material, which are not enumerated one by one in the embodiments of the present disclosure. In a case where the material of the support layer 22 has a relatively large rigidity, a portion of the support layer 22 located in the bending area 11 may be patterned to reduce the flexibility of the support layer in the bending area 11 and reduce bending difficulty of the display module 100.

The base layer 20 further includes an adhesive layer, which is used to bond the buffer layer 21 to the support layer 22. The material of the adhesive layer includes optical adhesive (optically clear adhesive (OCA)), pressure-sensitive adhesive or grid adhesive. For example, the thickness of the base layer 20 may be 150 μm to 300 μm. For example, the thickness of the base layer 20 may be 150 μm, 200 μm, or 300 μm, which are not enumerated one by one in the embodiments of the present disclosure.

The sound wave driving structure 30 is provided between the flexible display panel 10 and the base layer 20. The sound wave driving structure 30 is used to actuate (drive) the flexible display panel 10 to vibrate, thereby causing the flexible display panel 10 to emit sound.

In some embodiments, as shown in FIG. 2, the sound wave driving structure 30 includes a first electrode layer 31 and a second electrode layer 32. The first electrode layer 31 is closer to the flexible display panel 10 than the second electrode layer 32. The first electrode layer 31 and the second electrode layer 32 have a gap therebetween, and this gap causes a vibration space formed between the first electrode layer 31 and the second electrode layer 32. The first electrode layer 31 and the second electrode layer 32 can vibrate in the vibration space to actuate the flexible display panel 10 to vibrate, thereby causing the flexible display panel 10 to emit sound. For example, in a case where a vibration frequency of the flexible display panel 10 exceeds 20,000 HZ (Hertz), the flexible display panel 10 can emit ultrasonic waves, and the ultrasonic waves self-demodulate in the air to form audible sounds. The frequency of audible sound ranges from 20 HZ to 20,000 HZ.

Applying electrical signals with the same electrical property on the first electrode layer 31 and the second electrode layer 32 can cause the first electrode layer 31 and the second electrode layer 32 to repel each other; and applying electrical signals with opposite electrical properties on the first electrode layer 31 and the second electrode layer 32 can cause the first electrode layer 31 and the second electrode layer 32 to attract each other. The first electrode layer 31 and the second electrode layer 32 attract or repel each other, which can actuate (drive) the flexible display panel 10 to vibrate, thereby causing the flexible display panel 10 to emit sound.

It can be understood that the same electrical property means that the types of charges are the same. For example, positive charges or negative charges are input to both the first electrode layer 31 and the second electrode layer 32. The opposite electrical properties mean that the types of charges are different. For example, positive charges are input to the first electrode layer 31, while negative charges or no charges are input to the second electrode layer 32; alternatively, negative charges are input to the first electrode layer 31, while positive charges or no charges are input to the second electrode layer 32.

When the display apparatus is in a folded state, a portion of the first electrode layer located in the bending area and a portion of the second electrode layer located in the bending area will deform. During the vibration of the first electrode layer or the second electrode layer, the first electrode layer and the second electrode layer may come into contact, destroying the vibration state of the flexible display panel.

Figure 3:
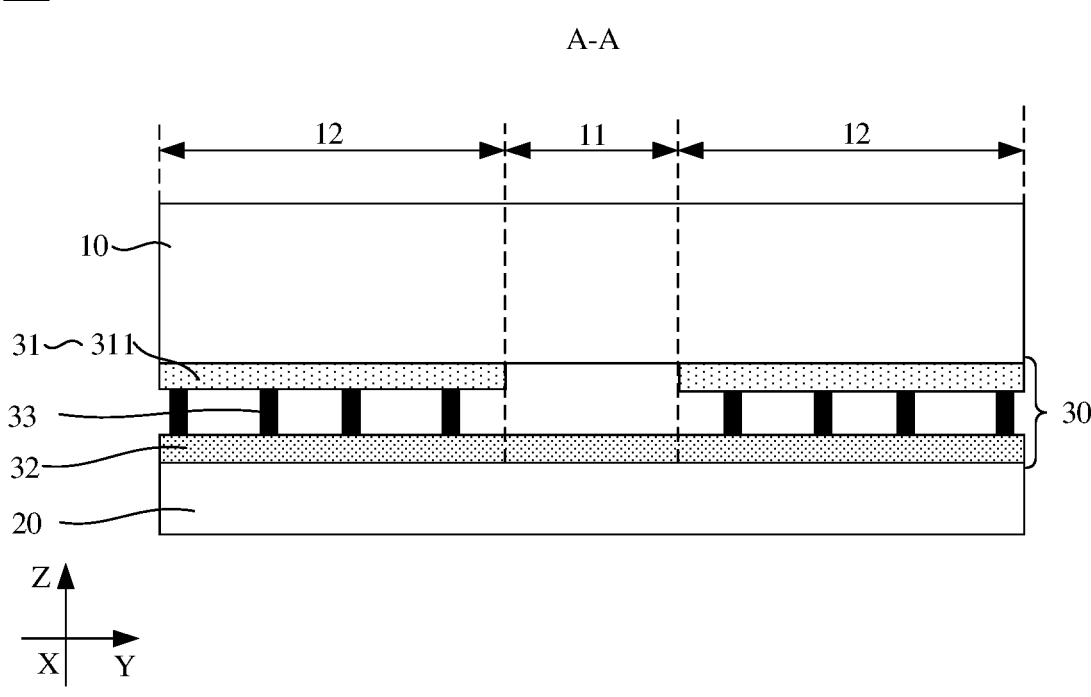
FIG. 3 is another sectional view taken along the section line A-A in FIG. 1.
Figure 4:
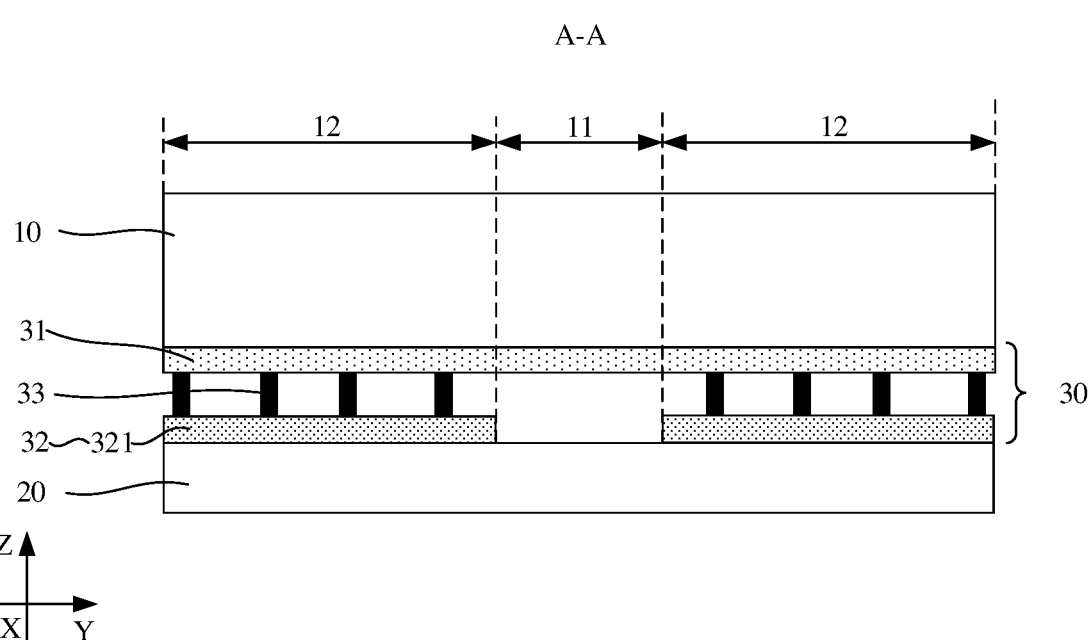
FIG. 4 is yet another sectional view taken along the section line A-A in FIG. 1.

In light of this, in some embodiments, as shown in FIG. 2 to FIG. 4, in the sound wave driving structure 30 of the embodiments of the present disclosure, an orthographic projection of at least one of the first electrode layer 31 and the second electrode layer 32 on the flexible display panel 10 is non-overlapping with the bending area 11. That is, the bending area 11 is not provided with at least one of the first electrode layer 31 and the second electrode layer 32. In this way, no matter whether the flexible display panel 10 is bent or not, the first electrode layer 31 and the second electrode layer 32 will not contact each other in the bending area 11, thereby reducing the risk of contact between the first electrode layer 31 and the second electrode layer 32 in the bending area 11.

In some other embodiments, as shown in FIG. 5 to FIG. 8, the sound wave driving structure 30 further includes an insulating spacing layer 39. The insulating spacing layer 39 is provided between the first electrode layer 31 and the second electrode layer 32, and an orthographic projection thereof on the flexible display panel 10 is located in the bending area 11. In this way, the insulating spacing layer 39 can separate a portion of the first electrode layer 31 located in the bending area 11 and a portion of the second electrode layer 32 located in the bending area 11, reducing the risk of the first electrode layer 31 and the second electrode layer 32 coming into contact in the bending area 11, regardless of whether or not the first electrode layer 31 and the second electrode layer 32 are deformed.

For example, as shown in FIG. 2, an orthographic projection of the first electrode layer 31 on the flexible display panel 10 is non-overlapping with the bending area 11, an orthographic projection of the second electrode layer 32 on the flexible display panel 10 is non-overlapping with the bending area 11, and the sound wave driving structure 30 does not include the insulating spacing layer 39.

For example, as shown in FIG. 3, the orthographic projection of the first electrode layer 31 on the flexible display panel 10 is non-overlapping with the bending area 11, the orthographic projection of the second electrode layer 32 on the flexible display panel 10 is at least partially located in the bending area 11, and the sound wave driving structure 30 does not include the insulating spacing layer 39.

For example, as shown in FIG. 4, the orthographic projection of the first electrode layer 31 on the flexible display panel 10 is at least partially located in the bending area 11, the orthographic projection of the second electrode layer 32 on the flexible display panel 10 is non-overlapping with the bending area 11, and the sound wave driving structure 30 does not include the insulating spacing layer 39.

Figure 5:
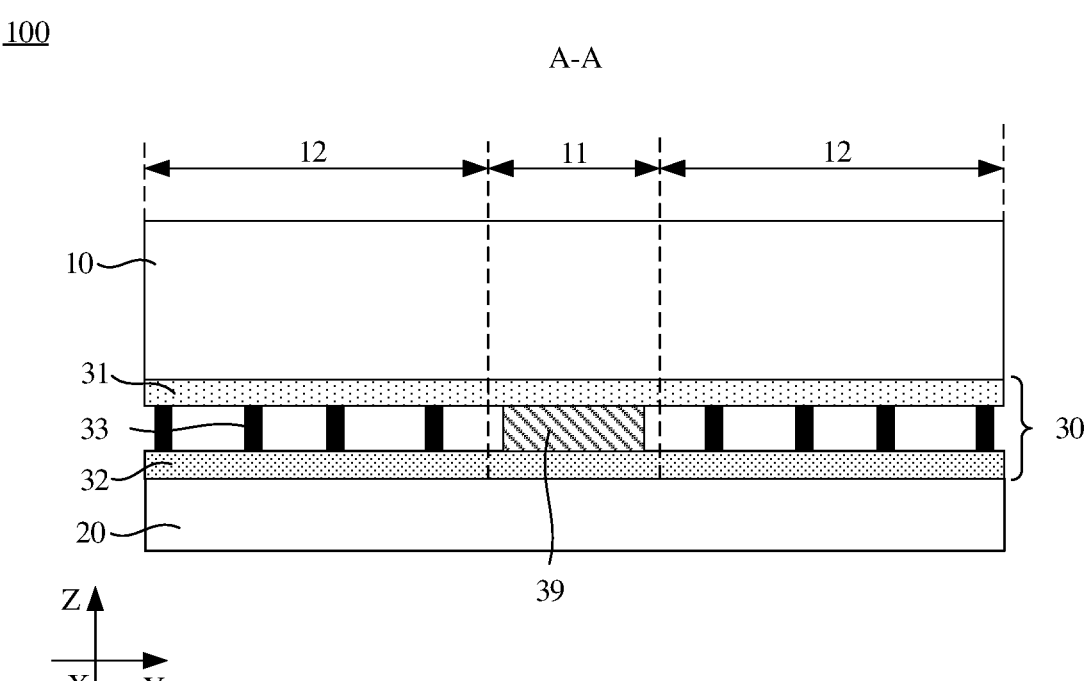
FIG. 5 is yet another sectional view taken along the section line A-A in FIG. 1.

For example, as shown in FIG. 5, the orthographic projection of the first electrode layer 31 on the flexible display panel 10 is at least partially located in the bending area 11, the orthographic projection of the second electrode layer 32 on the flexible display panel 10 is at least partially located in the bending area, and the sound wave driving structure 30 includes the insulating spacing layer 39.

Figure 6:
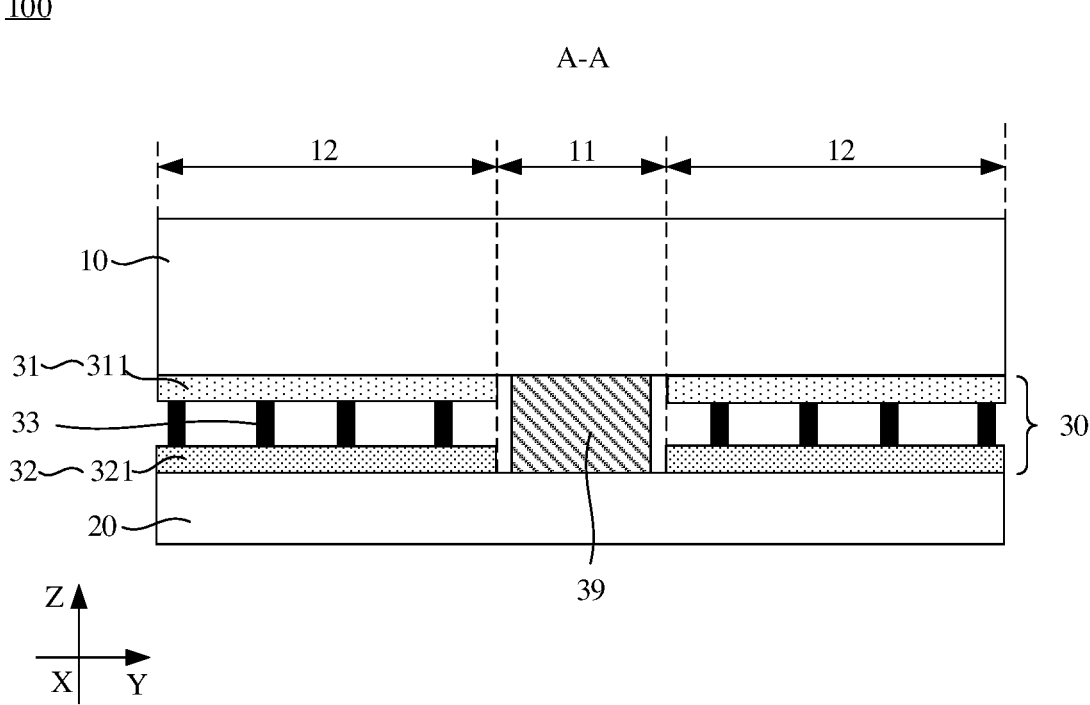
FIG. 6 is yet another sectional view taken along the section line A-A in FIG. 1.

For example, as shown in FIG. 6, the orthographic projection of the first electrode layer 31 on the flexible display panel 10 is non-overlapping with the bending area 11, the orthographic projection of the second electrode layer 32 on the flexible display panel 10 is non-overlapping with the bending area 11, and the sound wave driving structure 30 includes the insulating spacing layer 39.

Figure 7:
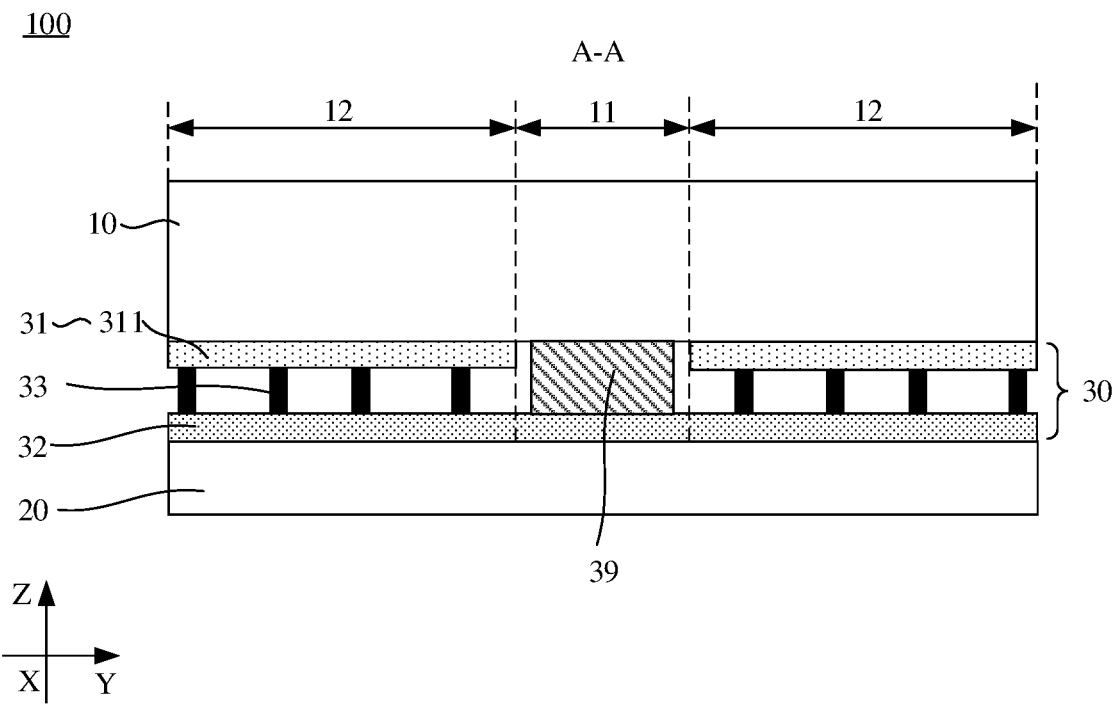
FIG. 7 is yet another sectional view taken along the section line A-A in FIG. 1.

For example, as shown in FIG. 7, the orthographic projection of the first electrode layer 31 on the flexible display panel 10 is non-overlapping with the bending area 11, the orthographic projection of the second electrode layer 32 on the flexible display panel 10 is at least partially located in the bending area 11, and the sound wave driving structure 30 includes the insulating spacing layer 39.

Figure 8:
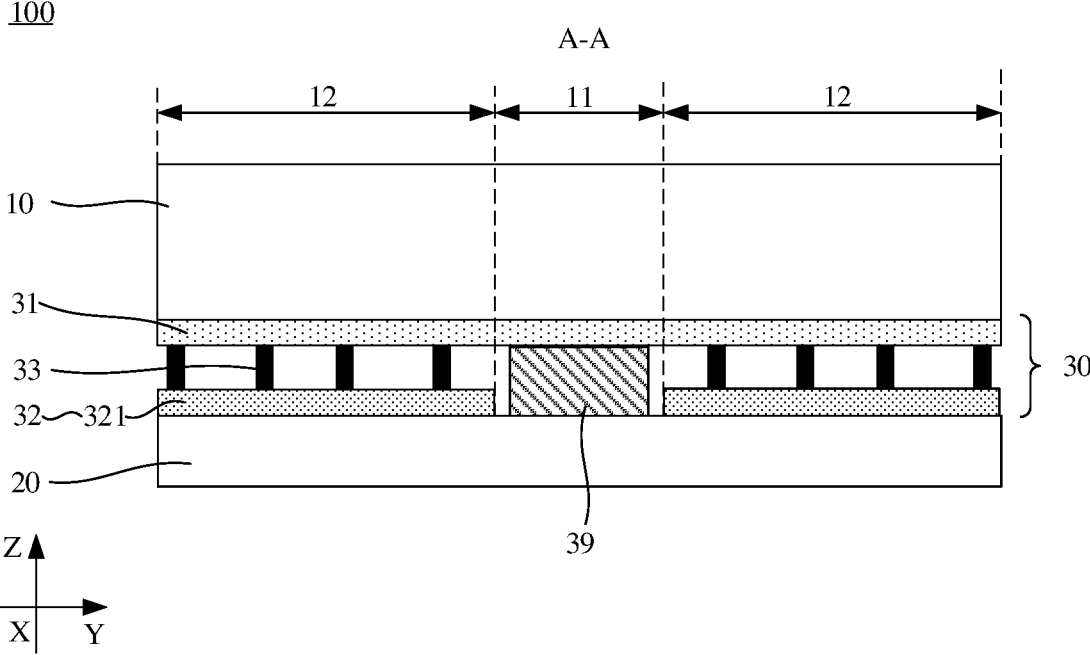
FIG. 8 is yet another sectional view taken along the section line A-A in FIG. 1.

For example, as shown in FIG. 8, the orthographic projection of the first electrode layer 31 on the flexible display panel 10 is at least partially located in the bending area 11, the orthographic projection of the second electrode layer 32 on the flexible display panel 10 is non-overlapping with the bending area 11, and the sound wave driving structure 30 includes the insulating spacing layer 39.

In some embodiments, the first electrode layer 31 includes at least two first electrodes 311, and each first electrode 311 is located in a non-bending area 11. In this way, it is possible to ensure that the orthographic projection of the first electrode layer 31 on the flexible display panel 10 is non-overlapping with the bending area 11.

In some other embodiments, the second electrode layer 32 includes at least two second electrodes 321, and each second electrode 321 is located in a non-bending area 11. In this way, it is possible to ensure that the orthographic projection of the second electrode layer 32 on the flexible display panel 10 is non-overlapping with the bending area 11.

For example, as shown in FIG. 2, the first electrode layer 31 includes at least two first electrodes 311, each first electrode 311 is located in a non-bending area 11; and the second electrode layer 32 includes at least two second electrodes 321, each second electrode 321 is located in a non-bending area 11.

For example, as shown in FIG. 3, the first electrode layer 31 includes at least two first electrodes 311, each first electrode 311 is located in a non-bending area 11; and the orthographic projection of the second electrode layer 32 on the flexible display panel 10 is at least partially located in the bending area 11.

For example, as shown in FIG. 4, the second electrode layer 32 includes at least two second electrodes 321, each second electrode 321 is located in a non-bending area 11; and the orthographic projection of the first electrode layer 31 on the flexible display panel 10 is at least partially located in the bending area 11.

In some embodiments, in a case where the first electrode layer 31 includes the at least two first electrodes 311, each first electrode 311 is located in a non-bending area 12. A boundary of an orthographic projection of the first electrode 311 on a plane where the flexible display panel 10 is located is located in a boundary of the non-bending area 12, and has a gap with the boundary of the non-bending area 12; alternatively, the boundary of the orthographic projection of the first electrode 311 on the flexible display panel 10 is overlapping with the boundary of the non-bending area 12; alternatively, of the boundary of the orthographic projection of the first electrode 311 on the flexible display panel 10, a portion is located in the boundary of the non-bending area 12, and another portion is overlapping with the non-bending area 12. For example, of the boundary of the orthographic projection of the first electrode 311 on the flexible display panel 10, a portion is located in the boundary of the non-bending area 12, and another portion is overlapping with the non-bending area 12.

In some embodiments, in a case where the second electrode layer 32 includes the at least two second electrodes 321, each second electrode 321 is located in a non-bending area 12. A boundary of an orthographic projection of the second electrode 321 on a plane where the flexible display panel 10 is located is located in a boundary of the non-bending area 12, and has a gap with the boundary of the non-bending area 12; alternatively, the boundary of the orthographic projection of the second electrode 321 on the flexible display panel 10 is overlapping with the boundary of the non-bending area 12; alternatively, of the boundary of the orthographic projection of the second electrode 321 on the flexible display panel 10, a portion is located in the boundary of the non-bending area 12, and another portion is overlapping with the non-bending area 12. For example, of the boundary of the orthographic projection of the second electrode 321 on the flexible display panel 10, a portion is located in the boundary of the non-bending area 12, and another portion is overlapping with the non-bending area 12.

In a case where the orthographic projection of the first electrode layer 31 on the flexible display panel 10 covers the bending area 11, that is, the bending area 11 is located in the orthographic projection of the first electrode layer 31 on the flexible display panel 10, the first electrode layer 31 has a continuous structure and is simple in structure. A boundary of an orthographic projection of the first electrode layer 31 on a plane where the flexible display panel 10 is located is located in a boundary of the flexible display panel 10, and has a gap with the boundary of the flexible display panel 10; alternatively, of the boundary of the orthographic projection of the first electrode layer 31 on the plane where the flexible display panel 10 is located, a portion is located in the boundary of the flexible display panel 10, and another portion is overlapping with the boundary of the flexible display panel 10. For example, the boundary of the orthographic projection of the first electrode layer 31 on the plane where the flexible display panel 10 is located is located in the boundary of the flexible display panel 10, and has the gap with the boundary of the flexible display panel 10.

In a case where the orthographic projection of the second electrode layer 32 on the flexible display panel 10 covers the bending area 11, that is, the bending area 11 is located in the orthographic projection of the second electrode layer 32 on the flexible display panel 10, the second electrode layer 32 has a continuous structure and is simple in structure. A boundary of an orthographic projection of the second electrode layer 32 on a plane where the flexible display panel 10 is located is located in a boundary of the flexible display panel 10, and has a gap with the boundary of the flexible display panel 10; alternatively, of the boundary of the orthographic projection of the second electrode layer 32 on the plane where the flexible display panel 10 is located, a portion is located in the boundary of the flexible display panel 10, and another portion is overlapping with the boundary of the flexible display panel 10. For example, the boundary of the orthographic projection of the second electrode layer 32 on the plane where the flexible display panel 10 is located is located in the boundary of the flexible display panel 10, and has the gap with the boundary of the flexible display panel 10.

In some embodiments, the material of the first electrode layer 31 and the second electrode layer 32 may be a metal oxide, and the metal oxide may be indium tin oxide (ITO) or indium zinc oxide (IZO). Alternatively, the material of the first electrode layer 31 and the second electrode layer 32 may be a metal, and the material of the metal may be silver (Ag), aluminum (Al) or copper (Cu). Alternatively, the material of the first electrode layer 31 and the second electrode layer 32 may also be an alloy, and the material of the alloy may be a magnesium-silver alloy or an aluminum-lithium alloy.

The thicknesses of the first electrode layer 31 and the second electrode layer 32 (a dimension along the Z direction in FIG. 2) may each be 100 nm to 1,000 nm. For example, the thicknesses of the first electrode layer 31 and the second electrode layer 32 may each be 100 nm, 400 nm, 800 nm or 1,000 nm, which are not enumerated one by one in the embodiments of the present disclosure.

It can be understood that the thicknesses of the first electrode layer 31 and the second electrode layer 32 may be different. For example, the thickness of the first electrode layer 31 is 200 nm, and the thickness of the second electrode layer 32 is 800 nm.

In some embodiments, as shown in FIG. 2 to FIG. 8, the sound wave driving structure 30 further includes a plurality of support columns 33, and the plurality of support columns 33 are provided between the first electrode layer 31 and the second electrode layer 32. The plurality of support columns 33 cause a gap to be formed between the first electrode layer 31 and the second electrode layer 32, whereby the first electrode layer 31 and the second electrode layer 32 can vibrate in the gap, thereby actuating the flexible display panel 10 to vibrate.

In some embodiments, an orthographic projection of the plurality of support columns 33 on the flexible display panel 10 is non-overlapping with the bending area 11. In this way, during the bending process the display module 100, the stress to which the first electrode layer 31 and the second electrode layer 32 are subjected may be reduced, reducing the risk of damage to the first electrode layer 31 and the second electrode layer 32.

For example, the plurality of support columns 33 are arranged into multiple rows of support columns 33 and multiple columns of support columns 33. Each row of support columns 33 includes multiple support columns 33 arranged along the second direction Y; and each column of support columns 33 includes multiple support columns 33 arranged along the first direction X. The plurality of support columns 33 are used to form a vibration space between the first electrode layer 31 and the second electrode layer 32, so that the first electrode layer 31 and the second electrode layer 32 can vibrate in the vibration space to actuate the flexible display panel 10 to vibrate.

For example, the height of the support column 33 may be 5 μm to 30 μm. For example, the height of the support column 33 (a dimension along the Z direction in FIG. 2) may be 5 μm, 10 μm, 20 μm or 30 μm, which are not enumerated one by one in the embodiments of the present disclosure.

The shape of the cross-section of the support column 33 in a direction perpendicular to its own extending direction may be a circle, a regular polygon, or an oblong, which are not enumerated one by one in the embodiments of the present disclosure.

The material of the support column 33 may be an organic material, and the organic material may be polyimide (PI), polycarbonate (PC), acrylic acid (AA), polyarylate (PAR), polyetherimide (PEI) or polyethylene naphthalate (PEN), which are not enumerated one by one in the embodiments of the present disclosure.

Figure 9:
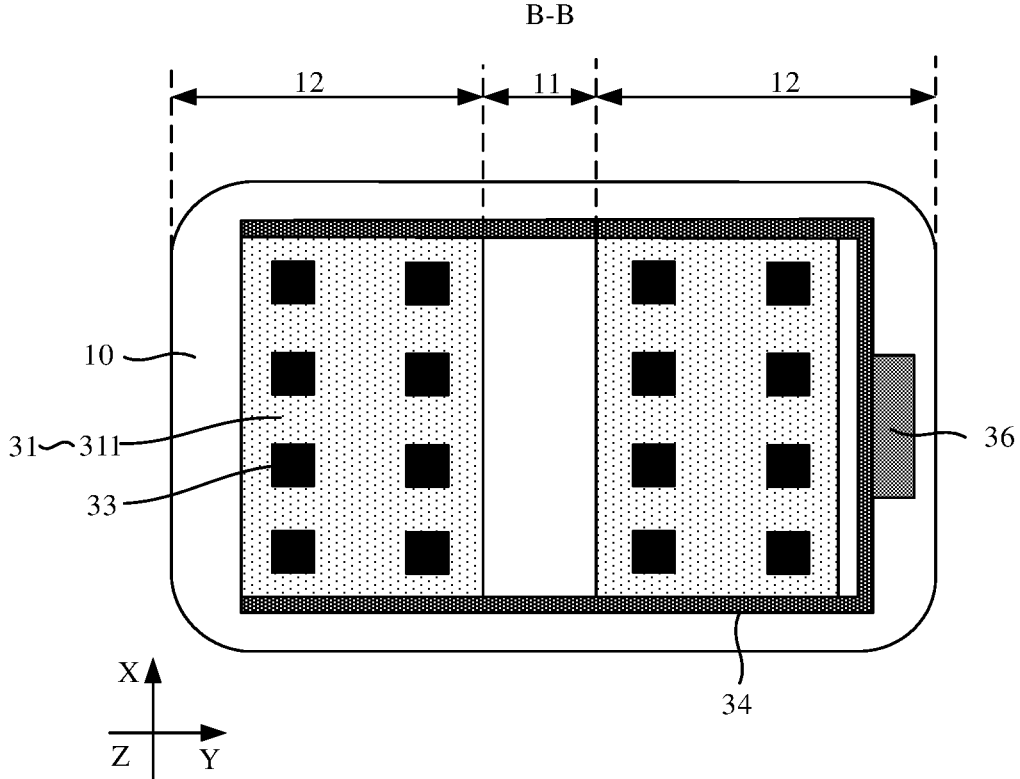
FIG. 9 is a sectional view taken along the section line B-B in FIG. 2.

As shown in FIG. 9, in order to apply electrical signals to the first electrode layer 31 and the second electrode layer 32, in a case where the first electrode layer 31 includes at least two first electrodes 311, the sound wave driving structure 30 further includes a first connection line 34, the first connection line 34 is provided on the flexible display panel 10 and is electrically connected to the at least two first electrodes 311. In this way, an electrical signal can be transmitted to all first electrodes 311 through the first connection line 34.

For example, in the case where the first electrode layer 31 includes at least two first electrodes 311, the sound wave driving structure 30 further includes two first connection lines 34. The two first connection lines 34 are respectively located on both sides of the first electrode layer 31 in the first direction X. The first connection lines 34 extend along the second direction Y and are electrically connected to edges of the at least two first electrodes 311 extending along the second direction Y. In this way, the voltage drop of the electrical signal transmitted by the first connection lines 34 to the first electrodes 311 may be reduced.

Figure 10:
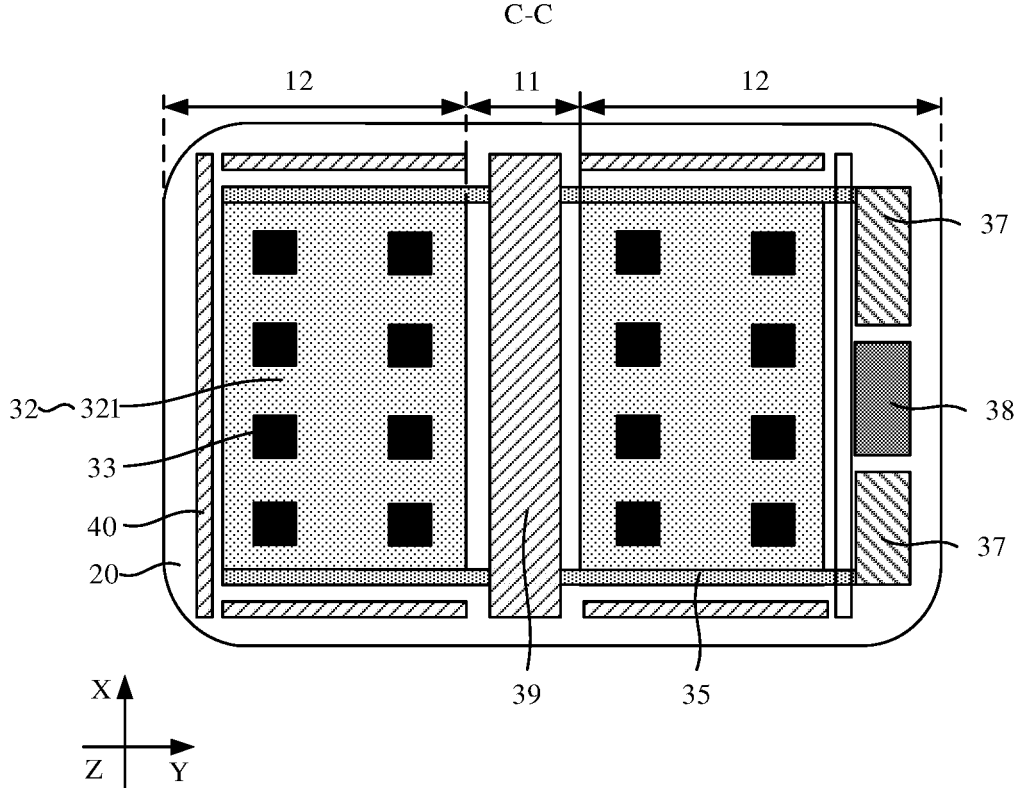
FIG. 10 is a sectional view taken along the section line C-C in FIG. 2.

As shown in FIG. 10, in a case where the second electrode layer 32 includes at least two second electrodes 321, the sound wave driving structure 30 further includes a second connection line 35, and the second connection line 35 is provided on the base layer 20 and is electrically connected to the at least two second electrodes 321. In this way, an electrical signal can be transmitted to all second electrodes 321 through the second connection line 35.

For example, in the case where the second electrode layer 32 includes at least two second electrodes 321, the sound wave driving structure 30 further includes two second connection lines 35. The two second connection lines 35 are respectively located on both sides of the second electrode layer 32 in the first direction X. The second connection lines 35 extend along the second direction Y and are electrically connected to edges of the at least two second electrodes 321 extending along the second direction Y. In this way, the voltage drop of the electrical signal transmitted by the second connection lines 35 to the second electrodes 321 may be reduced.

In some embodiments, the sound wave driving structure 30 further includes a first bonding electrode 36, a second bonding electrode 37, and a third bonding electrode 38.

As shown in FIG. 9, the first bonding electrode 36 is provided on the flexible display panel 10, and the first bonding electrode 36 is provided on a side of the first electrode layer 31 away from the bending area 11 in the second direction Y. The first bonding electrode 34 is electrically connected to the first electrode layer 31.

For example, in a case where the sound wave driving structure 30 further includes the first connection line 34, the first bonding electrode 36 is electrically connected to the first electrode layer 31 through the first connection line 34.

The second bonding electrode 37 and the third bonding electrode 38 are provided on the base layer 20. The second bonding electrode 37 and the third bonding electrode 38 are provided on a side of the second electrode layer 32 away from the bending area 11 in the second direction Y. The second bonding electrode 37 is electrically connected to the second electrode layer 32, and the third bonding electrode 38 and the second bonding electrode 37 are insulated from each other; and the third bonding electrode 38 is electrically connected to the first bonding electrode 36.

For example, in a case where the sound wave driving structure 30 further includes the second connection line 35, the second bonding electrode 37 is electrically connected to the second electrode layer 32 through the second connection line 35.

In a case where the sound wave driving structure 30 includes two second connection lines 35, the sound wave driving structure 30 includes two second bonding electrodes 37, and the second bonding electrodes 37 are respectively provided on both sides of the third bonding electrode 38 in the first direction X, and are electrically connected to the two second connection lines 35 respectively.

In a case where the orthographic projections of the first electrode layer 31 and the second electrode layer 32 on the flexible display panel 10 both cover the bending area 11, the sound wave driving structure 30 includes a first bonding electrode 36, a second bonding electrode 37 and a third bonding electrode 38. The first bonding electrode 36 is electrically connected to the first electrode layer 31, the second bonding electrode 37 is electrically connected to the second electrode layer 32, the third bonding electrode 38 is electrically connected to the first bonding electrode 36, and the second bonding electrode 37 and the third bonding electrode 38 are insulated from each other. In this case, the sound wave driving structure 30 may not be provided with the first connection line 34 and the second connection line 35, and is simple in structure.

In some embodiments, the display module 100 further includes a driver chip. The driver chip is electrically connected to the second bonding electrode 37 and the third bonding electrode 38 through a flexible circuit board. In this way, the driver chip can apply an electrical signal to the first connection line 34 through the first bonding electrode 36 and the third bonding electrode 38, so the first connection line 34 transmits the received electrical signal to the first electrode layer 31, and can apply an electrical signal to the second connection line 35 through the second bonding electrode 37, so the second connection line 35 transmits the received electrical signal to the second electrode layer 32. The first electrode layer 31 and the second electrode layer 32 attract or repel each other to actuate the flexible display panel 10 to vibrate and emit ultrasonic waves.

As shown in FIG. 5, in the case where the orthographic projections of the first electrode layer 31 and the second electrode layer 32 on the flexible display panel 10 both cover the bending area 11, the first electrode layer 31 and the second electrode layer 32 are both continuous structures. The display module 100 further includes an insulating spacing layer 39. The insulating spacing layer 39 is provided between the first electrode layer 31 and the second electrode layer 32, and an orthographic projection of the insulating spacing layer 39 on the flexible display panel 10 is located in the bending area 11.

Along the second direction Y, a distance between the insulating spacing layer 39 and support columns 33 proximate to the insulating spacing layer 39 is greater than or equal to 5 mm. For example, the distance between the insulating spacing layer 39 and the support columns 33 proximate to the insulating spacing layer 39 may be 5 mm, 8 mm or 10 mm, which are not enumerated one by one in the embodiments of the present disclosure. In this way, the first electrode layer 31 and the second electrode layer 32 can also vibrate between the insulating spacing layer 39 and the support columns 33 proximate to the insulating spacing layer 39, which may make a vibration area of the flexible display panel 10 large and improve the quality of the sound emitted by the flexible display panel 10.

Along a direction perpendicular to the flexible display panel 10 (a third direction Z), two surfaces of the insulating spacing layer 39 are in contact with the first electrode layer 31 and the second electrode layer 32 respectively. In this way, in a case where the display apparatus 1000 is folded, the insulating spacing layer 39 may reduce the risk of contact between the first electrode layer 31 and the second electrode layer 32 in the bending area 11.

As shown in FIG. 6, in a case where each of the orthographic projections of the first electrode layer 31 and the second electrode layer 32 on the flexible display panel 10 is non-overlapping with the bending area 11, the first electrode layer 31 includes at least two first electrodes 11, and the second electrode layer 32 includes at least two second electrodes 321. The display module 100 further includes an insulating spacing layer 39, and an orthographic projection of the insulating spacing layer 39 on the flexible display panel 10 is located in the bending area 11.

Along the second direction Y, a distance between the insulating spacing layer 39 and support columns 33 proximate to the insulating spacing layer 39 is greater than or equal to 5 mm. For example, the distance between the insulating spacing layer 39 and the support columns 33 proximate to the insulating spacing layer 39 may be 5 mm, 8 mm or 10 mm, which are not enumerated one by one in the embodiments of the present disclosure. In this way, the flexible display panel 10 may have a large vibration area, thereby improving the quality of the sound emitted by the flexible display panel 10.

In some embodiments, a surface of the insulating spacing layer 39 proximate to the flexible display panel 10 is flush with a surface of the first electrode layer 31 proximate to the flexible display panel 10, and a surface of the insulating spacing layer 39 proximate to the base layer 20 is flush with a surface of the second electrode layer 32 proximate to the base layer 20. In this way, the insulating spacing layer 39 can fill a gap between the flexible display panel 10 and the base layer 20 within the bending area 11, thereby reducing the deformation of the display module 100 during the bending process.

Along the second direction Y, a surface of the insulating spacing layer 39 proximate to the first electrode 311 and a surface of the first electrode 311 proximate to the insulating spacing layer 39 may be in contact with or separated from each other; and a surface of the insulating spacing layer 39 proximate to the second electrode 321 and a surface of the second electrode 321 proximate to the insulating spacing layer 39 may be in contact with or separated from each other.

"Flush" includes absolutely flush and approximately flush, and "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

As shown in FIG. 7, in a case where the orthographic projection of the first electrode layer 31 on the flexible display panel 10 is non-overlapping with the bending area 11, and the orthographic projection of the second electrode layer 32 on the flexible display panel 10 covers the bending area 11, the first electrode layer 31 includes at least two first electrodes 311, and the second electrode layer 32 is a continuous structure. The display module 100 further includes an insulating spacing layer 39, and an orthographic projection of the insulating spacing layer 39 on the flexible display panel 10 is located in the bending area 11.

Along the second direction Y, a distance between the insulating spacing layer 39 and support columns 33 proximate to the insulating spacing layer 39 is greater than or equal to 5 mm. For example, the distance between the insulating spacing layer 39 and the support columns 33 proximate to the insulating spacing layer 39 may be 5 mm, 8 mm or 10 mm, which are not enumerated one by one in the embodiments of the present disclosure. In this way, the flexible display panel 10 may have a large vibration area, thereby improving the quality of the sound emitted by the flexible display panel 10.

A surface of the insulating spacing layer 39 proximate to the flexible display panel 10 is flush with a surface of the first electrode layer 31 proximate to the flexible display panel 10, and a surface of the insulating spacing layer 39 proximate to the base layer 20 is in contact with the second electrode layer 32. The deformation of the display module 100 during the bending process may be reduced.

Along the second direction Y, a surface of the insulating spacing layer 39 proximate to the first electrode 311 and a surface of the first electrode 311 proximate to the insulating spacing layer 39 may be in contact with or separated from each other.

As shown in FIG. 8, in a case where an orthographic projection of the second electrode layer 32 on the flexible display panel 10 is non-overlapping with the bending area 11, and an orthographic projection of the first electrode layer 31 on the flexible display panel 10 covers the bending area 11, the second electrode layer 32 includes at least two second electrodes 321, and the first electrode layer 31 is a continuous structure. The display module 100 further includes an insulating spacing layer 39 provided between the first electrode layer 31 and the second electrode layer 32, and an orthographic projection of the insulating spacing layer 39 on the flexible display panel 10 is located in the bending area 11.

A distance between the insulating spacing layer 39 and support columns 33 proximate to the insulating spacing layer 39 is greater than or equal to 5 mm. For example, the distance between the insulating spacing layer 39 and the support columns 33 proximate to the insulating spacing layer 39 may be 5 mm, 8 mm or 10 mm, which are not enumerated one by one in the embodiments of the present disclosure. In this way, the flexible display panel 10 may have a large vibration area, thereby improving the quality of the sound emitted by the flexible display panel 10.

A surface of the insulating spacing layer 39 proximate to the flexible display panel 10 is in contact with the first electrode layer 31, and a surface of the insulating spacing layer 39 proximate to the base layer 20 is flush with a surface of the second electrode layer 32 proximate to the base layer 20. The deformation of the display module 100 during the bending process may be reduced.

Along the second direction Y, a surface of the insulating spacing layer 39 proximate to the second electrode 321 and a surface of the second electrode 321 proximate to the insulating spacing layer 39 may be in contact with or separated from each other.

In some embodiments, as shown in FIG. 10, the sound wave driving structure 30 further includes a mold frame 40. The mold frame 40 is arranged around a peripheral of the first electrode layer 31 and the second electrode layer 32. The mold frame 40 forms a vibration cavity with the flexible display panel 10 and the base layer 20. The mold frame 40 can reduce the risk of dust in the air entering the display module 100. In a case where the display module 100 further includes an insulating spacing layer 39, the insulating spacing layer 39 and the mold frame 40 are made of the same material and are arranged in the same layer.

For example, the material of the mold frame 40 and the insulating spacing layer 39 may be epoxy resin (EP) or pressure-sensitive adhesive (PSA), which are not enumerated one by one in the embodiments of the present disclosure. In this way, the uniformity of materials in the display module 100 may be improved, which is conducive to reducing the manufacturing cost of the sound wave driving structure 30.

In the case where the sound wave driving structure 30 includes the insulating spacing layer 39, the insulating spacing layer 39 further divides the vibration cavity into at least two sub-cavities.

For example, as shown in FIG. 11 to FIG. 14, in the case where the sound wave driving structure 30 includes the insulating spacing layer 39 and the mold frame 40, a surface of the mold frame 40 proximate to the flexible display panel 10 is flush with a surface of the insulating spacing layer 39 proximate to the flexible display panel 10, and a surface of the mold frame 40 proximate to the base layer 20 is flush with a surface of the insulating spacing layer 39 proximate to the base layer 20. In this way, the mold frame 40 and the insulating spacing layer 39 may be formed through a single patterning process to reduce the manufacturing cost of the sound wave driving structure 30.

Figures 11, 12:
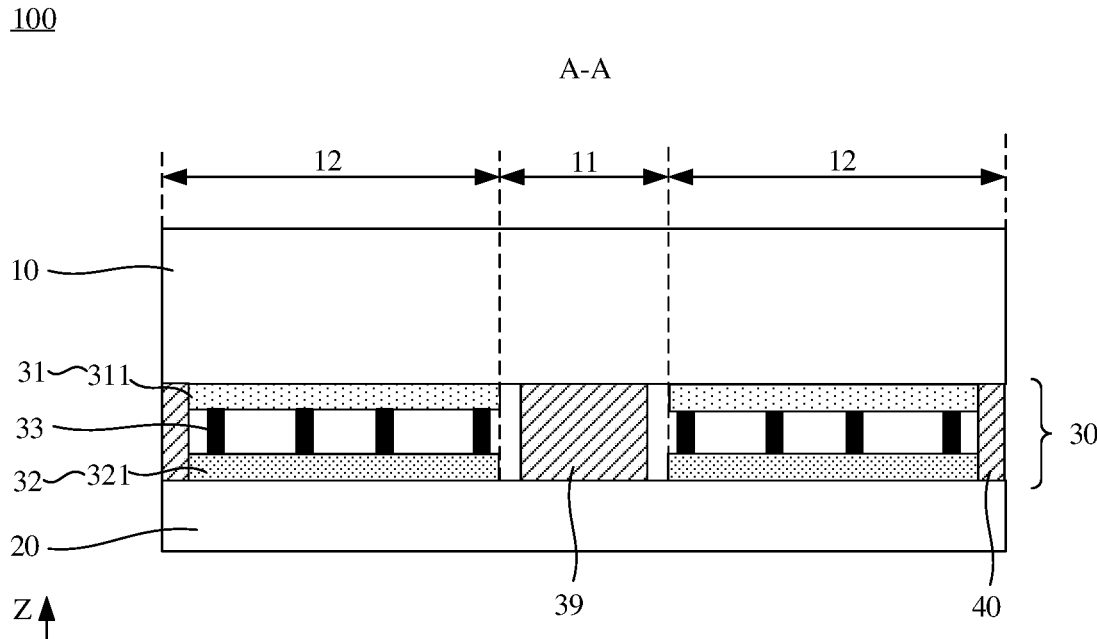
FIG. 11 is yet another sectional view taken along the section line A-A in FIG. 1.
FIG. 12 is yet another sectional view taken along the section line A-A in FIG. 1.
Figure 14:
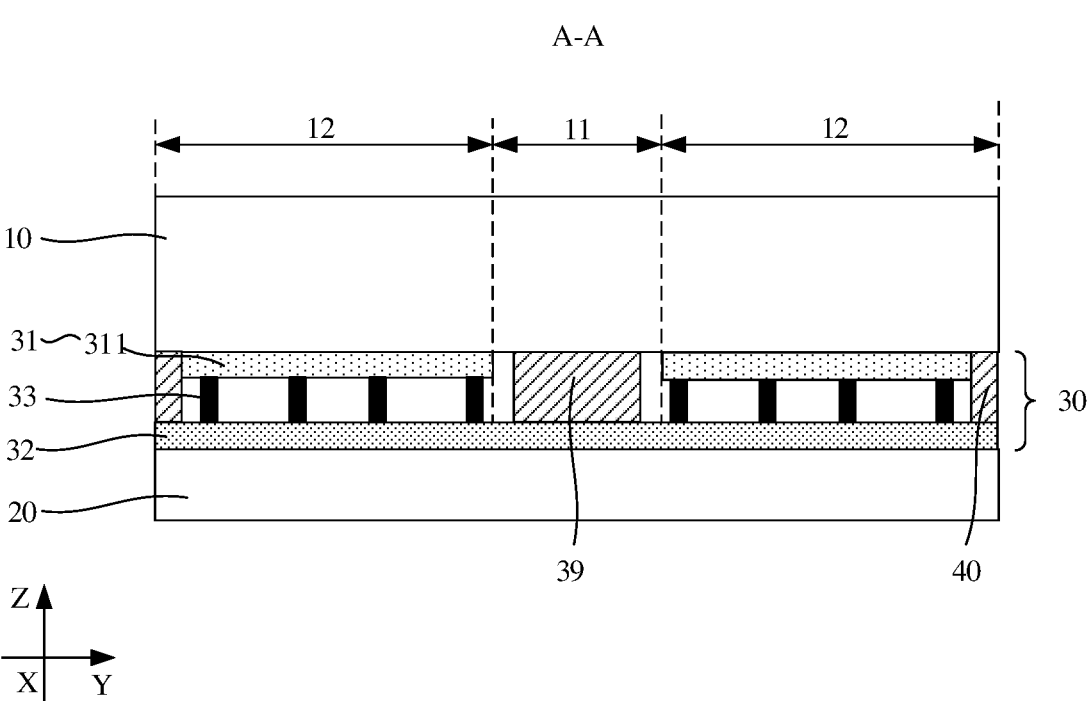
FIG. 14 is yet another sectional view taken along the section line A-A in FIG. 1.

As shown in FIG. 11 and FIG. 14, in a case where a surface of the insulating spacing layer 39 proximate to the flexible display panel 10 is flush with a surface of the first electrode layer 31 proximate to the flexible display panel 10, the mold frame 40 is arranged around the outside of the first electrode layer 31. In this way, the mold frame 40 and the insulating spacing layer 39 may be formed through a single patterning process to reduce the manufacturing cost of the sound wave driving structure 30.

Figure 13:
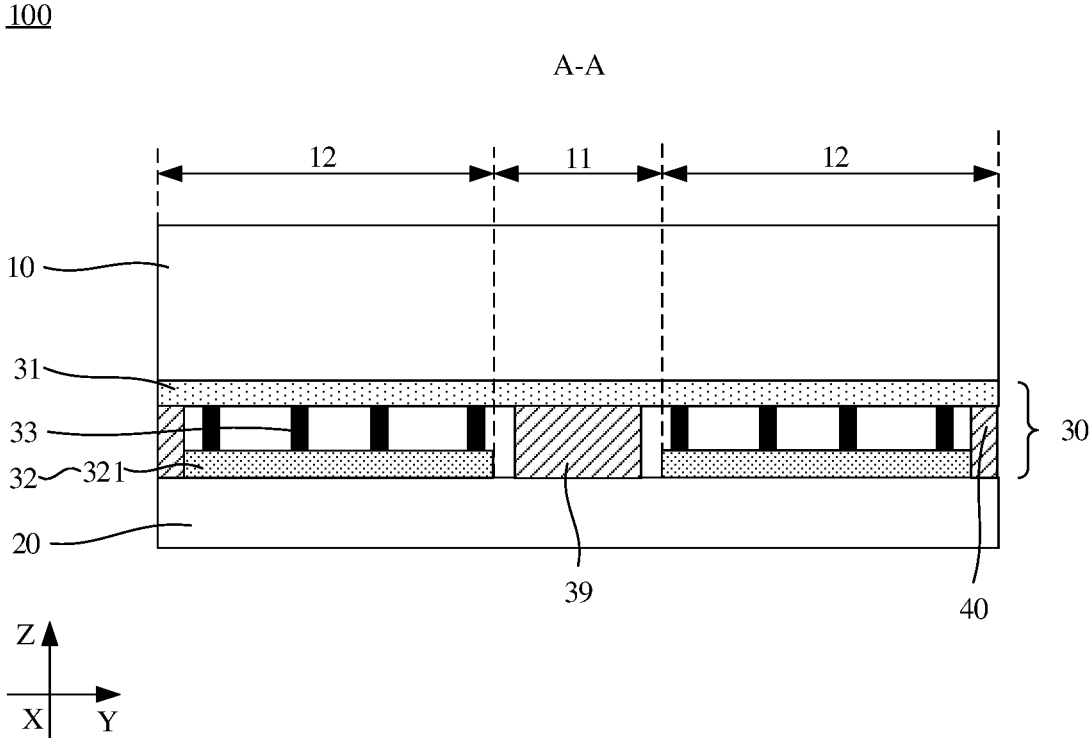
FIG. 13 is yet another sectional view taken along the section line A-A in FIG. 1.

As shown in FIG. 12 and FIG. 13, in a case where a surface of the insulating spacing layer 39 proximate to the flexible display panel 10 is contact with the first electrode layer 31, an orthographic projection of the mold frame 40 on the flexible display panel 10 is located within a range of the orthographic projection of the first electrode layer 31 on the flexible display panel 10, and the surface of the mold frame 40 proximate to the flexible display panel 10 is in contact with the first electrode layer 31. In this way, the mold frame 40 and the insulating spacing layer 39 may be formed through a single patterning process to reduce the manufacturing cost of the sound wave driving structure 30.

As shown in FIG. 11 and FIG. 13, in a case where a surface of the insulating spacing layer 39 away from the flexible display panel 10 is flush with a surface of the second electrode layer 32 away from the flexible display panel 10, the mold frame 40 is arranged around the outside of the second electrode layer 32. In this way, the mold frame 40 and the insulating spacing layer 39 may be formed through a single patterning process to reduce the manufacturing cost of the sound wave driving structure 30.

As shown in FIG. 12 and FIG. 14, in a case where a surface of the insulating spacing layer 39 away from the flexible display panel 10 is contact with the second electrode layer 32, an orthographic projection of the mold frame 40 on the flexible display panel 10 is located within a range of the orthographic projection of the second electrode layer 32 on the flexible display panel 10, and the surface of the mold frame 40 away from the flexible display panel 10 is in contact with the second electrode layer 32. In this way, the mold frame 40 and the insulating spacing layer 39 may be formed through a single patterning process to reduce the manufacturing cost of the sound wave driving structure 30.

Figure 15:
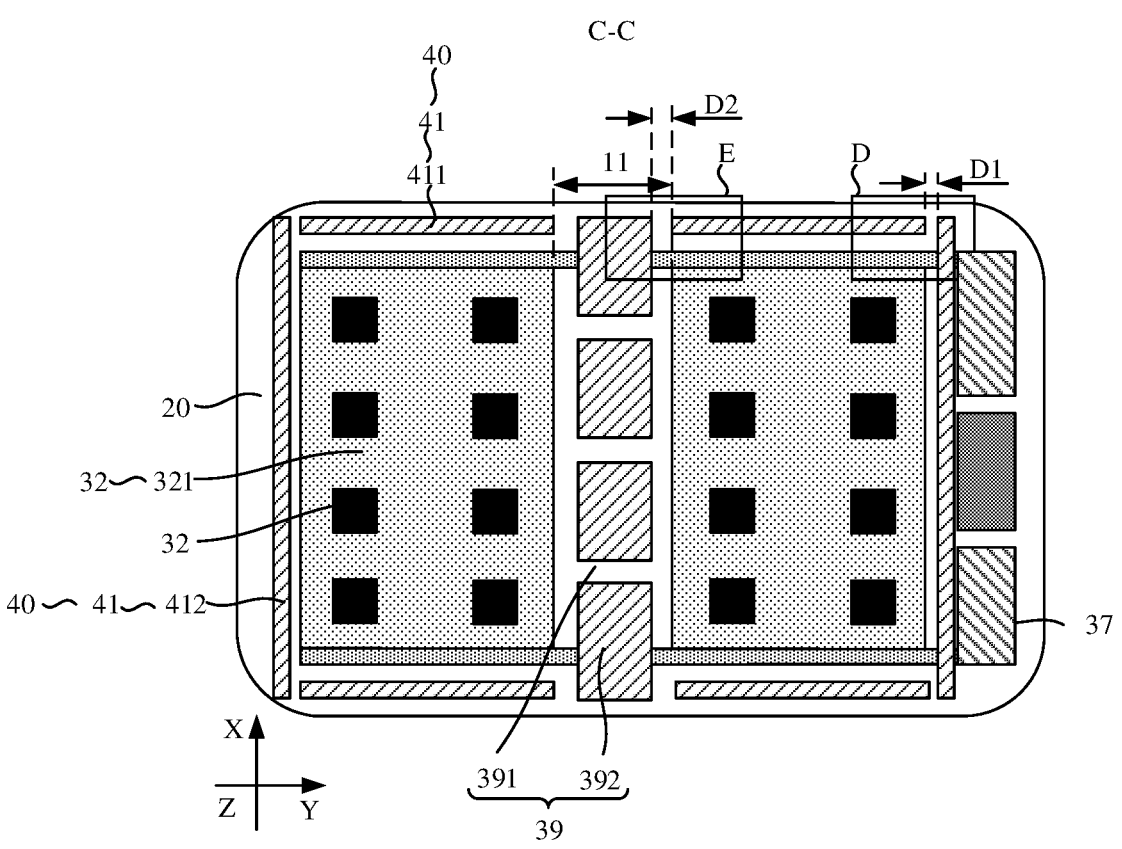
FIG. 15 is another sectional view taken along the section line C-C in FIG. 2.

In some embodiments, as shown in FIG. 15, the mold frame 40 includes a plurality of mold strips 41, and two adjacent mold strips 41 have a first gap D1 therebetween. The first gap D1 communicates the vibration cavity with the outside environment, so that the air can move in and out across the display module 100 through the first gap D1. In this way, the pressure in the vibration cavity remains unchanged, which may reduce the risk of separation between the first electrode layer 31 and the flexible display panel 10 or between the second electrode layer 32 and the base layer 20.

For convenience of description, a mold strip 41 extending along the second direction Y is named a first mold strip 411, and a mold strip 3011 extending along the first direction X is named a second mold strip 412.

For example, the mold frame 40 may include 4 mold strips 41, 6 mold strips 41, or 8 mold strips 41, which are not enumerated one by one in the embodiments of the present disclosure. For example, as shown in FIG. 15, in a case where the flexible display panel 10 includes one bending area 11 and two non-bending areas 12, the mold frame 40 includes 6 mold strips 41, among which 4 first mold strips 411 are divided into two groups of first mold strips 411. The two groups of first mold strips 411 are located at both ends of the second electrode layer 32 along the first direction X and are spaced apart from the second electrode layer 32. Each group of first mold strips 411 includes two first mold strips, and the two first mold strips 411 are arranged at intervals along the second direction Y. Two second mold strips 412 are located at both ends of the second electrode layer along the second direction Y and are spaced apart from the second electrode layer 32.

Figure 16:
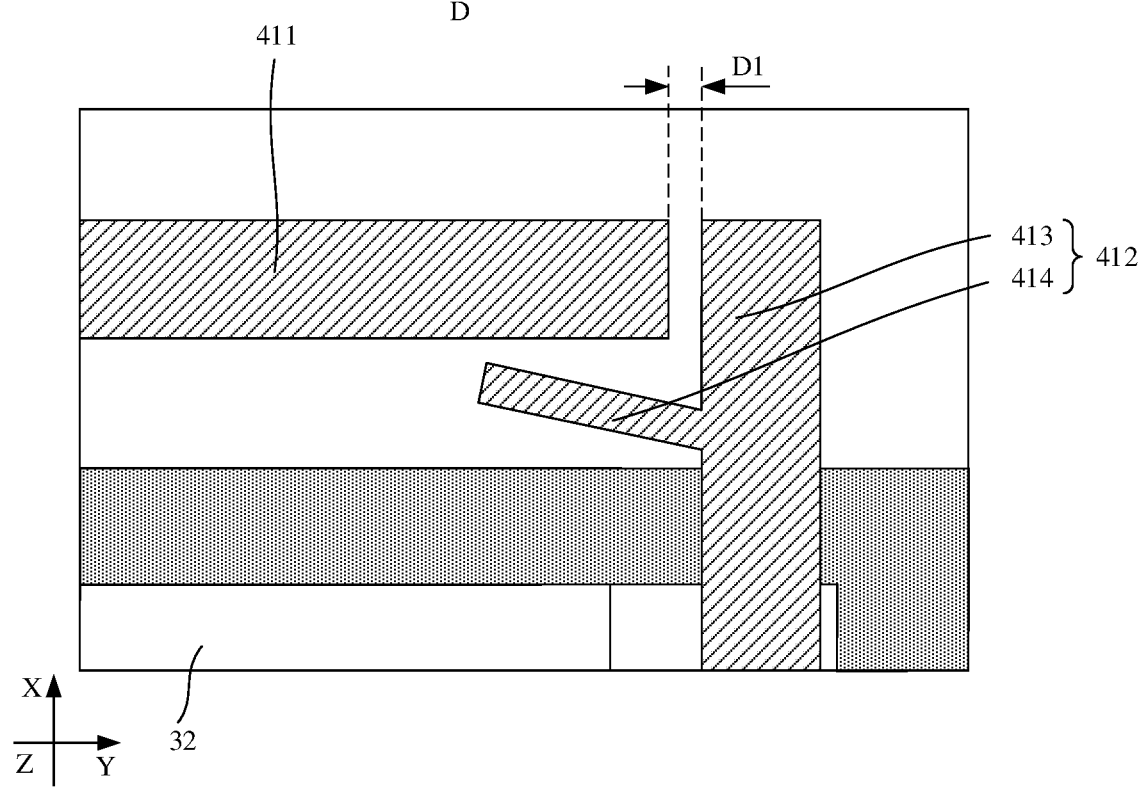
FIG. 16 is a partial enlargement view of the region D in FIG. 15.
Figure 18:
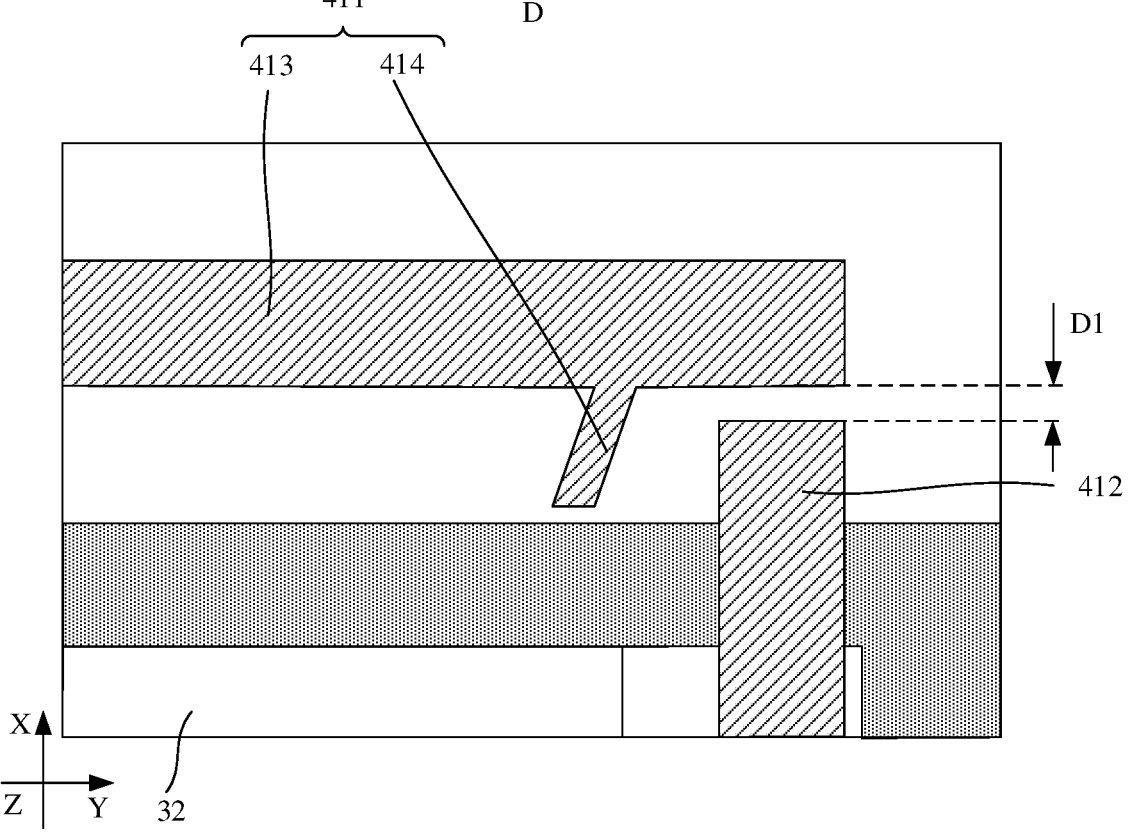
FIG. 18 is yet another partial enlargement view of the region D in FIG. 15.

At a corner of the non-bending area 12 away from the bending area 11, two adjacent mold strips 41 have a first distance D1, which means that a first mold strip 411 and a second mold strip 412 have a first gap D1 at the corner of the non-bending area 12. As shown in FIG. 16 and FIG. 18, one of the two adjacent mold strips 41 includes a body portion 413 and a first protruding portion 414. The body portion 413 extends along the peripheral of the first electrode layer 31 and the second electrode layer 32. One end of the first protruding portion 414 is connected to the body portion 413, and the other end extends into the vibration cavity. The first protruding portion 414 is disposed opposite to the first gap D1. In the process of the air entering the flexible display panel 10 through the first gap D1, dust in the air will adhere to a surface of the first protruding portion 414 facing the first gap D1, which reduces the risk of dust in the air entering the flexible display panel 10.

As shown in FIG. 16 and FIG. 18, the other of the two adjacent mold strips 41 extends along the peripheral of the first electrode layer 31 and the second electrode layer 32, and an extending direction of the first protruding portion 414 may be at an angle to an extending direction of the other mold strip 41.

Figure 17:
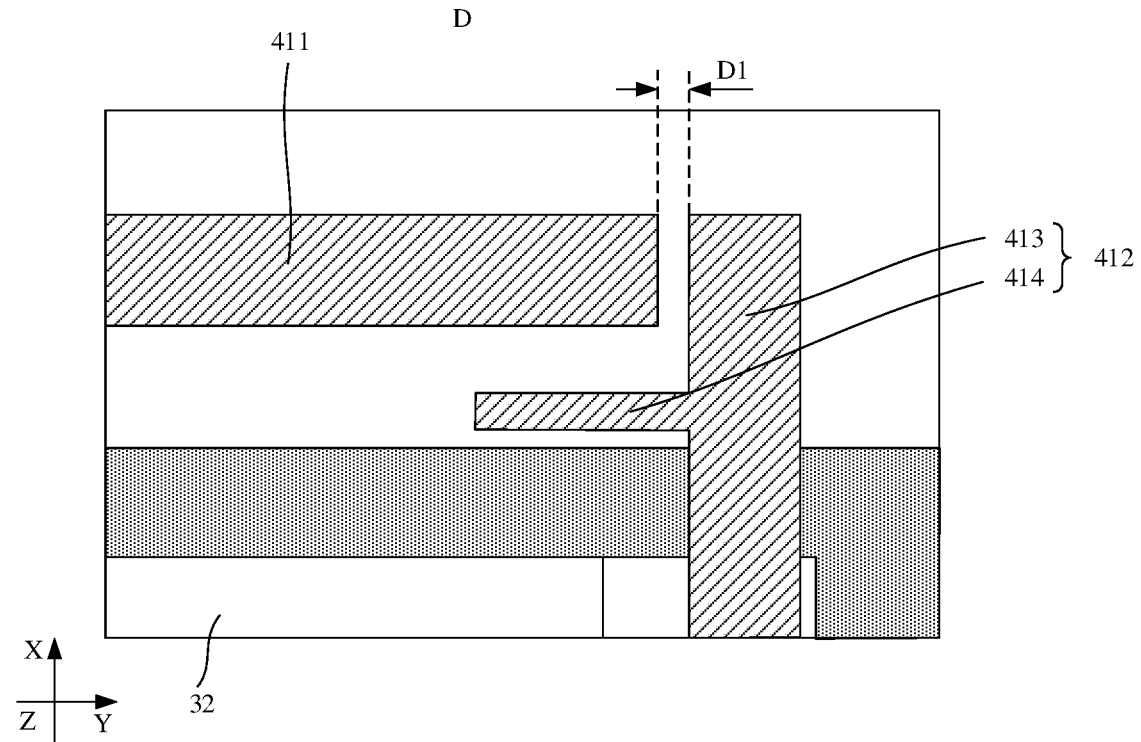
FIG. 17 is another partial enlargement view of the region D in FIG. 15.
Figure 19:
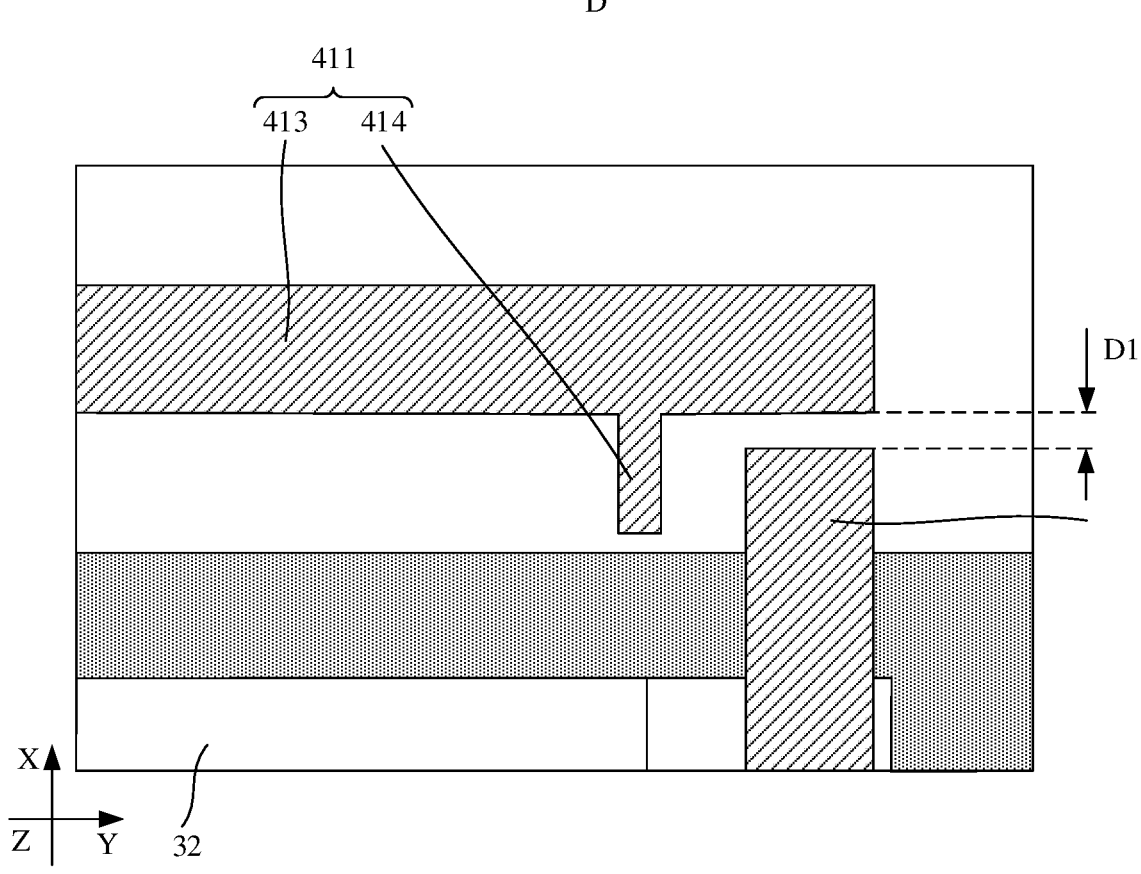
FIG. 19 is yet another partial enlargement view of the region D in FIG. 15.

As shown in FIG. 17 and FIG. 19, the other of the two adjacent mold strips 41 extends along the peripheral of the first electrode layer 31 and the second electrode layer 32, and an extending direction of at least a part of the first protruding portion 414 is parallel to an extending direction of the other mold strip 41, where "parallel" includes absolute parallel and approximately parallel, and the acceptable deviation range of approximately parallel may be, for example, a deviation within 5°.

As shown in FIG. 16 and FIG. 17, in a case where the second mold strip 412 includes a body portion 413 and a first protruding portion 414, the body portion 413 extends along the peripheral of the first electrode layer 31 and the second electrode layer 32. One end of the first protruding portion 414 is connected to the body portion 413, and the other end extends into the vibration cavity. The first protruding portion

414 is disposed opposite to the first gap D1, and the first protruding portion 414 is disposed opposite to the first mold strip 411. For example, as shown in FIG. 17, an extending direction of the first protruding portion 414 is substantially parallel to an extending direction of the first mold strip 411. A distance of the first gap D1 is greater than 1 mm, a distance between the first protruding portion 414 and the first mold strip 411 is greater than 5 mm, and the first gap D1 is less than the distance between the first protruding portion 414 and the first mold strip 411.

As shown in FIG. 18 and FIG. 19, in a case where the first mold strip 411 includes a body portion 413 and a first protruding portion 414, the body portion 413 extends along the peripheral of the first electrode layer 31 and the second electrode layer 32. One end of the first protruding portion 414 is connected to the body portion 413, and the other end extends into the vibration cavity. The first protruding portion 414 intersects an extending direction of the first gap D1, and the first protruding portion 414 is disposed opposite to the second mold strip 412. For example, an extending direction of the first protruding portion 414 is substantially parallel to an extending direction of the second mold strip 412. A distance of the first gap D1 is greater than 1 mm, a distance between the first protruding portion 414 and the second mold strip 412 is greater than 5 mm, and the first gap D1 is less than the distance between the first protruding portion 414 and the second mold strip 412.

In some embodiments, as shown in FIG. 15, the insulating spacing layer 39 includes an opening 391 penetrating through the insulating spacing layer 39 along the second direction Y, and the opening 391 communicates the at least two sub-cavities on both sides of the insulating spacing layer 39. In this way, vibration states of the flexible display panel 10 in the non-bending areas 12 are approximately the same, that is, during the vibration process of the flexible display panel 10, the influence of the sub-cavities on the vibration state of the flexible display panel 10 is reduced.

For example, the opening 391 cuts off the insulating spacing layer 39, the insulating spacing layer 39 includes a plurality of openings 391, and the plurality of openings 139 cut off the insulating spacing layer 39 to form a plurality of insulating blocks 392 spaced apart along the first direction X. Along the first direction X, a distance between two adjacent insulating blocks 392 is greater than or equal to 10 mm. For example, the distance between two adjacent insulating blocks 392 is 10 mm, 15 mm, or 20 mm, which are not enumerated one by one in the embodiments of the present disclosure.

Figure 20:
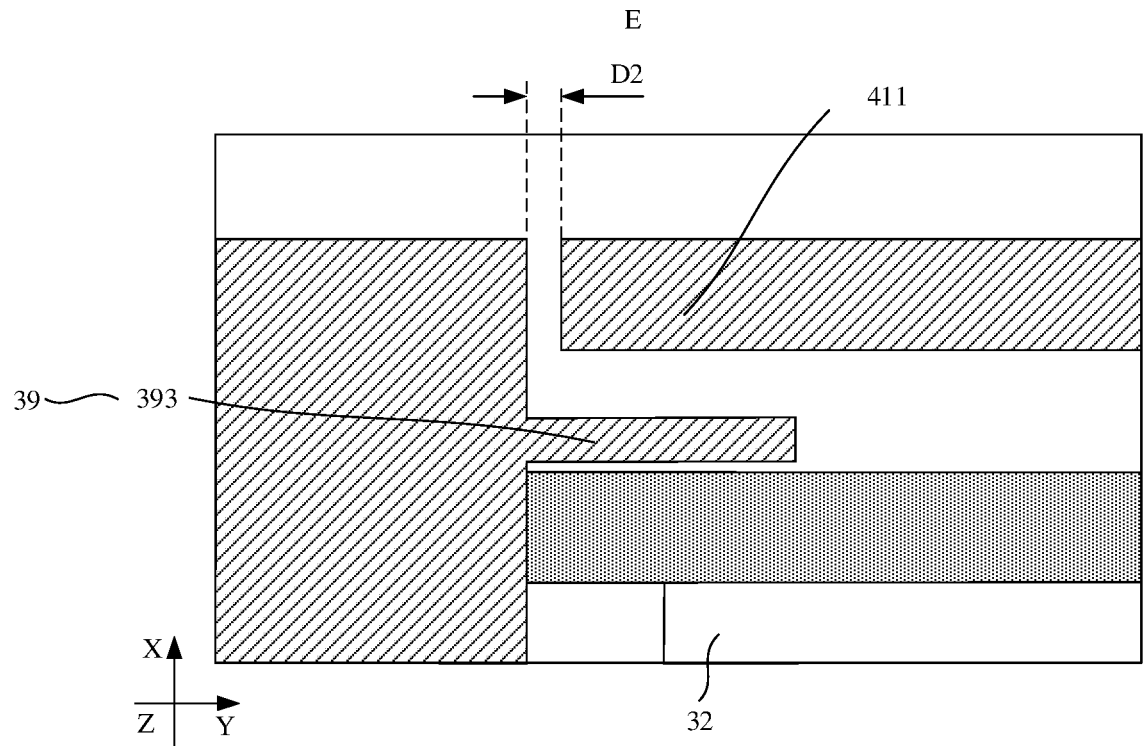
FIG. 20 is a partial enlargement view of the region E in FIG. 15.

As shown in FIG. 20, an orthographic projection of the mold frame 40 on the flexible display panel 10 is non-overlapping with the bending area 11. The insulating spacing layer 39 and the mold frame 40 have a second gap D2 therebetween. The insulating spacing layer 39 includes a second protruding portion 393, and the second protruding portion 393 intersects an extending direction of the second gap D2. Air can move in and out across the display module 100 through the second gap D2. In the process of the air entering the flexible display panel 10 through the second gap D2, dust in the air will adhere to a surface of the second protruding portion 393 facing the second gap D2, which reduces the risk of dust in the air entering the flexible display panel 10.

For example, as shown in FIG. 20, the insulating spacing layer 39 is provided between two adjacent mold strips 41. The insulating spacing layer 39 and a first mold strip 411 have a second gap D2. The insulating spacing layer 39 includes a second protruding portion 393, and the second protruding portion 393 intersects an extending direction of the second gap D2.

Figure 21:
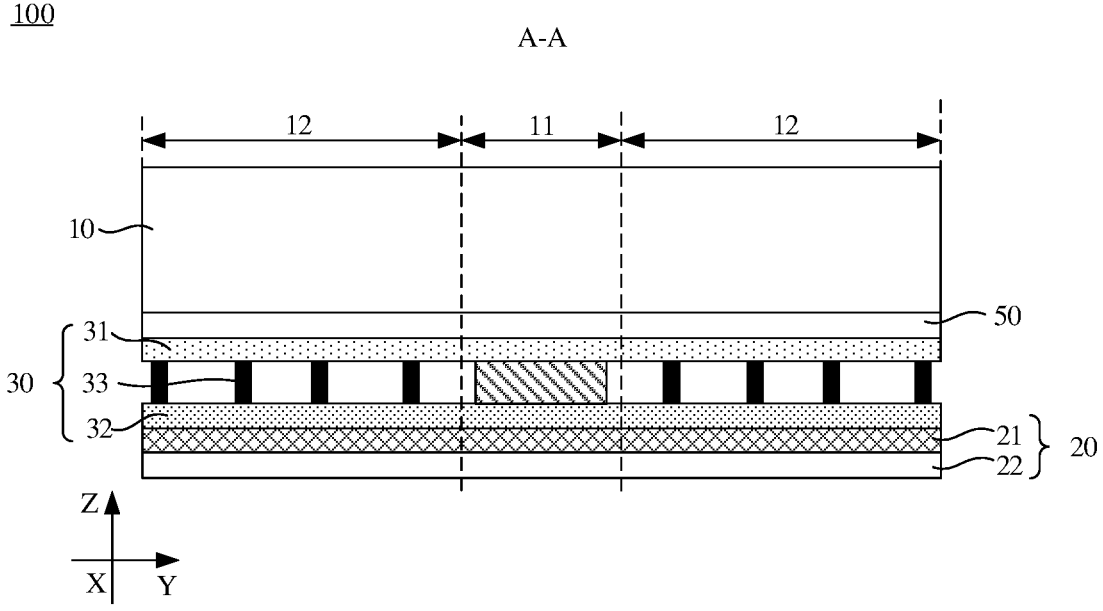
FIG. 21 is yet another sectional view taken along the section line A-A in FIG. 1.

In some embodiments, the display module 100 further includes a back film 50. As shown in FIG. 21, the back film 50 is provided between the sound wave driving structure 30 and the flexible display panel 10. The first electrode layer 31 is provided on a surface of the back film 50, and the second electrode layer is provided on a surface of the buffer layer 21. In this way, the back film 50 can protect the flexible display panel 10 and reduce the risk of the flexible display panel 10 being scratched.

Figure 22:
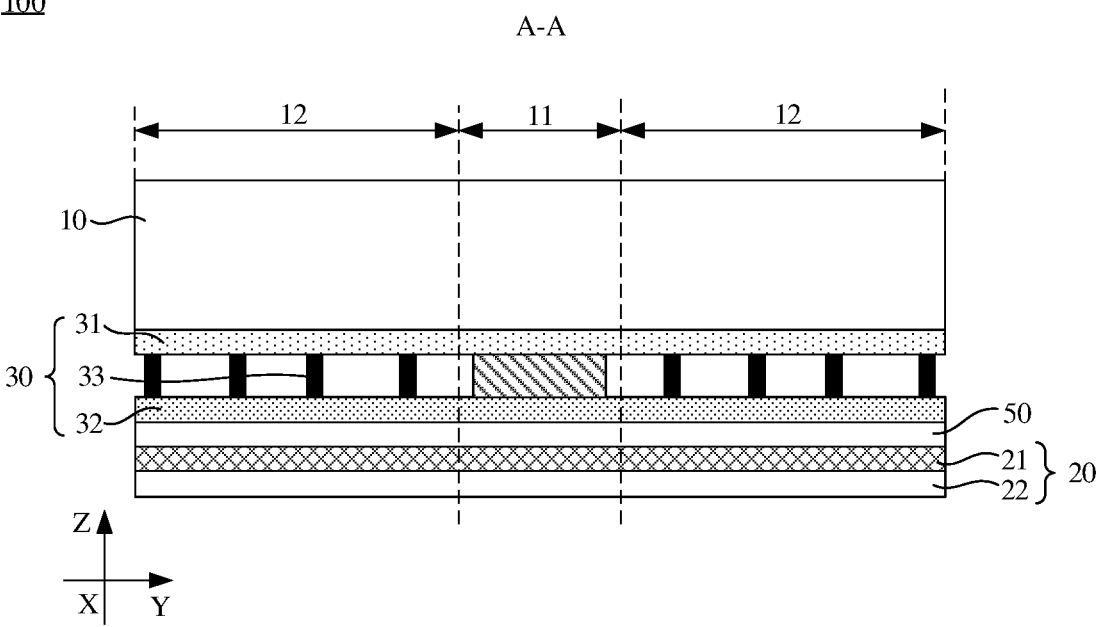
FIG. 22 is yet another sectional view taken along the section line A-A in FIG. 1.

Alternatively, as shown in FIG. 22, the back film 50 is provided between the sound wave driving structure 30 and the base layer 20, the first electrode layer 31 is provided on the non-display side of the flexible display panel 10, and the second electrode layer 32 is provided on a surface of the back film 50. In this way, there are fewer film layers on the sound wave driving structure 30, and the force required by the sound wave driving structure 30 to drive the flexible display panel 10 to vibrate is small, which may extend the service life of the sound wave driving structure 30.

For example, the first electrode layer 31 is provided on the flexible display panel 10 (proximate to the surface of the base layer 20). That is, using the flexible display panel 10 as a substrate, the first electrode layer 31 is formed on the flexible display panel 10 through a film forming process (such as deposition, photolithography, etc.). The second electrode layer 32 is provided on the base layer 20 (proximate to the surface of the flexible display panel 10). That is, using the base layer 20 as a substrate, the second electrode layer 32 is formed on the base layer 20 through a film forming process.

In a case where the back film 50 is provided between the sound wave driving structure 30 and the flexible display panel 10, the first connection line 34 is provided on the back film 50 and is electrically connected to at least two first electrodes 311. The second connection line 35 is provided on the buffer layer 21 and is electrically connected to at least two second electrodes 321.

In the case where the sound wave driving structure 30 further includes a first bonding electrode 36, a second bonding electrode 37 and a third bonding electrode 38, the first bonding electrode 36 is provided on the back film 50, and the second bonding electrode 37 and the third bonding electrode 38 are provided on the buffer layer 21.

In a case where the back film 50 is provided between the sound wave driving structure 30 and the base layer 20, the first connection line 34 is provided on the flexible display panel 10 and is electrically connected to at least two first electrodes 311, and the second connection line 35 is provided on the back film 50 and is electrically connected to at least two second electrodes 321.

In the case where the sound wave driving structure 30 further includes a first bonding electrode 36, a second bonding electrode 37 and a third bonding electrode 38, the first bonding electrode 36 is provided on the flexible display panel 10, and the second bonding electrode 37 and the third bonding electrode 38 are provided on the back film 50.

Figure 23:
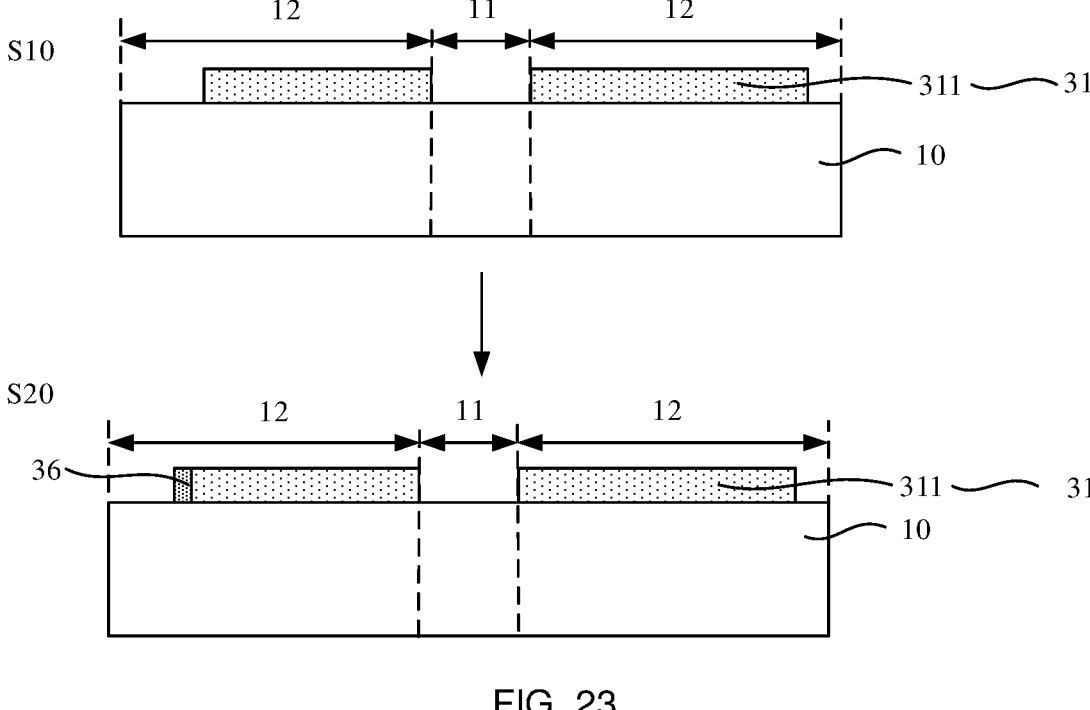
FIG. 23 to FIG. 25 are step diagrams of a method for manufacturing a display module, in accordance with embodiments of the present disclosure.
Figure 24:
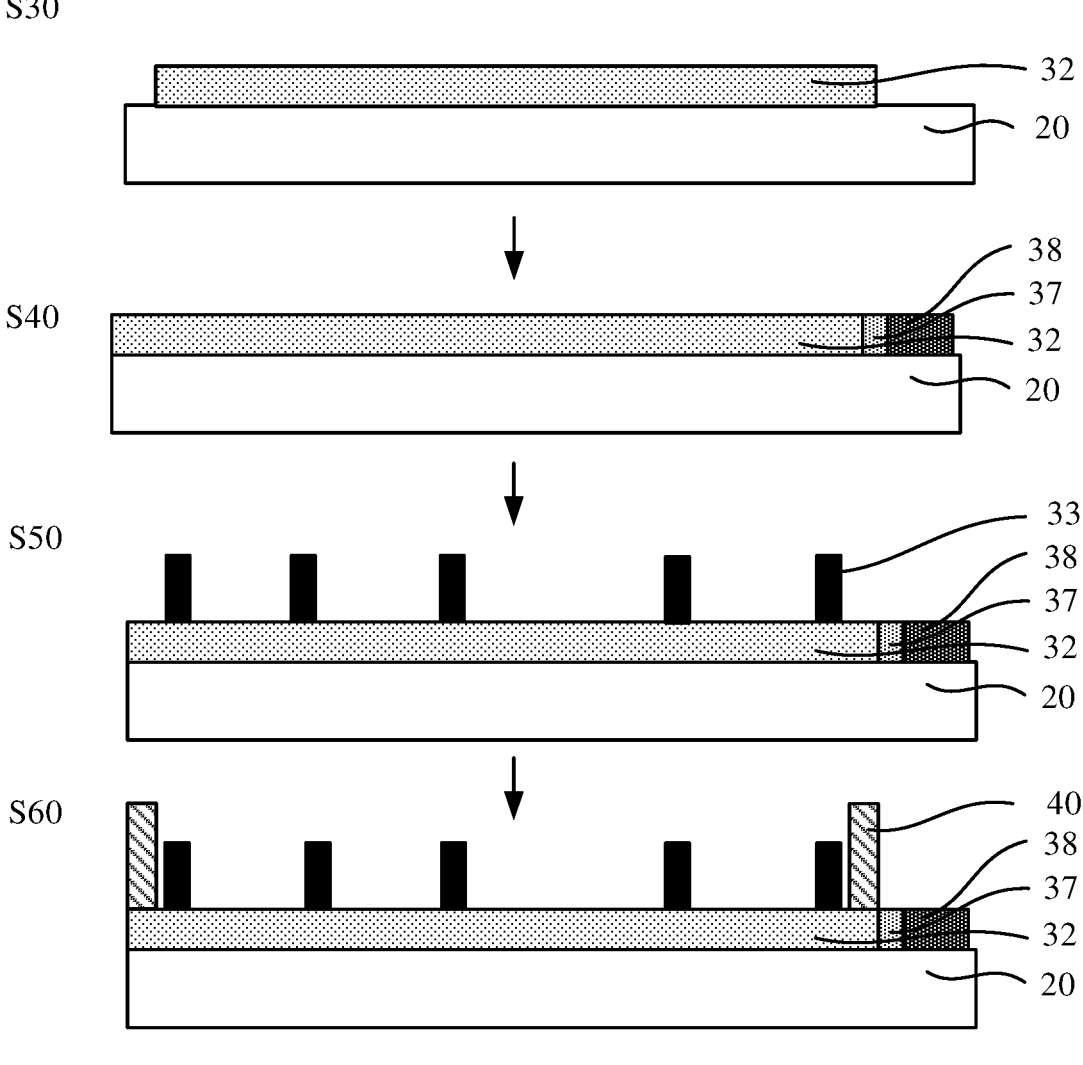
Figure 25:
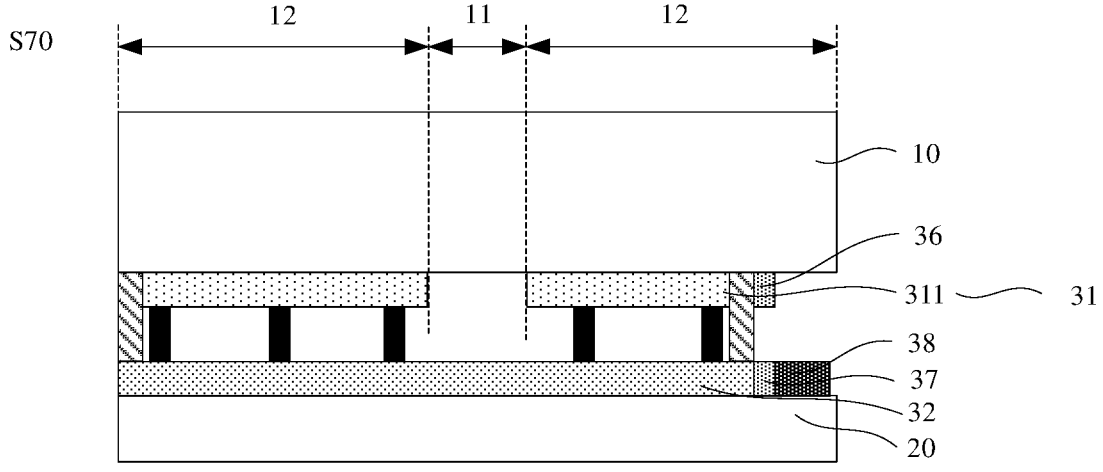
Figure 25:
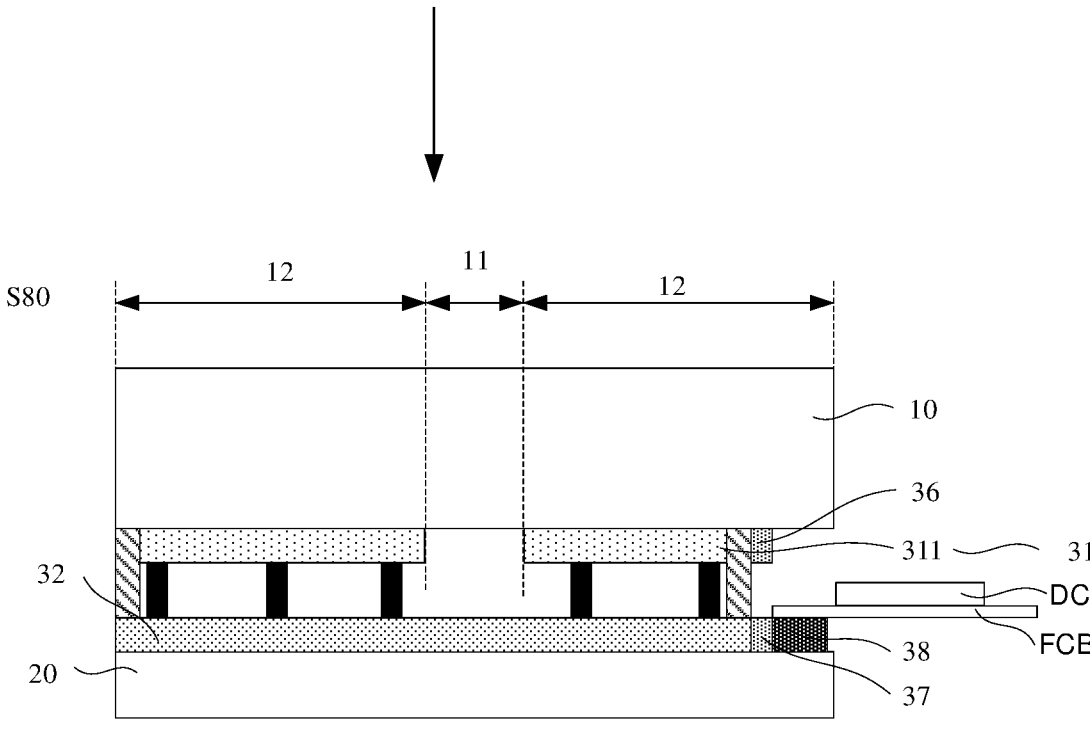

Embodiments of the present disclosure further provide a method for manufacturing the display module 100, considering an example in which the orthographic projection of the first electrode layer 31 on the flexible display panel 10 is non-overlapping with the bending area 11, the orthographic projection of the second electrode layer 32 on the flexible display panel 10 covers the bending area 11, and the sound wave driving structure 30 includes the insulating spacing layer 39, as shown in FIG. 23 to FIG. 25, the above manufacturing method includes steps S10 to S80.

In S10, the first electrode layer 31 is formed on the non-display side of the flexible display panel.

For example, in a case where the display module 100 includes a back film 50 and the back film 50 is located between the sound wave driving structure 30 and the flexible display panel 10, the first electrode layer 31 may be formed on a surface of the back film 50 proximate to the base layer 20.

For example, in a case where the display module 100 includes a back film 50 and the back film 50 is located between the base layer 20 and the sound wave driving structure 30, the first electrode layer 31 may be formed on a surface of the flexible display panel 10 proximate to the base layer 20.

For example, S10 includes steps S11 and S12.

In S11, a first conductive material is deposited on the non-display side of the flexible display panel 10.

For example, the first conductive material may be deposited using a thin film deposition process of chemical vapor deposition (CVD), physical vapor deposition (PVD), atomic layer deposition (ALD), or any combination thereof. For the first conductive material, refer to the material of the first electrode layer 31 mentioned above, which will not be described again here.

In S12, the first conductive material is patterned to form the first electrode layer 31.

The first electrode layer 31 includes at least two first electrodes 311, and each first electrode 311 is located in a non-bending area 11.

For example, a process such as chemical mechanical polishing (CMP) or dry/wet etching may be used to remove a portion of the first conductive material located in the bending area 11.

It can be understood that the patterned first electrode layer 31 may also be directly formed through a mask. For example, the first electrode layer 31 may be directly formed using a vapor deposition process in conjunction with a mask.

It can be understood that in a case where the orthographic projection of the first electrode layer 31 on the flexible display panel 10 covers the bending area 11, the process of forming the first electrode layer 31 may omit the process of patterning the first conductive material.

In S20, the first connection line 34 (not shown in the figures) and the first bonding electrodes 36 are formed on the non-display side of the flexible display panel 10 in sequence.

For example, a thin film deposition process of CVD, PVD, ALD or any combination thereof may be used to form the first connection line 34 and the first bonding electrodes 36 in sequence. The first bonding electrodes 36 are provided on a side of the first electrode layer 31 in the second direction, and the first bonding electrode 36 is electrically connected to the first electrode layer 31.

It can be understood that in a case where the orthographic projection of the first electrode layer 31 on the flexible display panel 10 covers the bending area 11, the first connection line 34 does not need to be made.

In S30, the second electrode layer 32 is formed on the surface of the base layer 20 proximate to the flexible display panel 10.

For example, in a case where the display module 100 includes a back film 50 and the back film 50 is located between the sound wave driving structure 30 and the flexible display panel 10, the second electrode layer 32 is formed on a surface of the base layer 20 proximate to the flexible display panel 10 32.

For example, in a case where the display module 100 includes a back film 50 and the back film 50 is located between the base layer 20 and the sound wave driving structure 30, the second electrode layer 32 is formed on a surface of the back film 50 proximate to the flexible display panel 10.

For example, the second electrode layer 32 may be formed using a thin film deposition process of chemical vapor deposition (CVD), physical vapor deposition (PVD), atomic layer deposition (ALD), or any combination thereof.

In S40, the second connection line 35 (not shown in the figures), the second bonding electrode 37 and the third bonding electrode 38 are formed on the base layer 20 in sequence.

For example, the second connection line 35, the second bonding electrode 37 and the third bonding electrode 38 may be formed using a thin film deposition process of chemical vapor deposition (CVD), physical vapor deposition (PVD), atomic layer deposition (ALD) or any combination thereof. The second bonding electrode 37 and the third bonding electrode 38 are provided on a side of the second electrode layer 32 in the second direction Y. The second bonding electrode 37 is electrically connected to the second electrode layer 32, and the second bonding electrode 37 and the third bonding electrode 38 are insulated from each other.

It can be understood that the order of steps S10 and S20 and the order of steps S30 and S40 may be interchanged. That is, S10, S20, S30, and S40 may be performed in sequence; or S30 and S40 may be performed first, and then S10 and S20 are performed.

In S50, a plurality of support columns 33 are formed on the second electrode layer 32.

For example, S50 includes steps S51 and S52.

In S51, a support material is applied on the second electrode layer 32.

For example, a coating process may be used to coat the second electrode layer 32 with the support material. For the support material, refer to the material of the support columns 33 mentioned above, which will not be described again here.

In S52, the support material is patterned to form the plurality of support columns 33.

For example, a process such as CMP or dry/wet etching may be used to remove the excess in the material for the support columns 33 to obtain the plurality of preset support columns 33. An orthographic projection of the plurality of support columns 33 on the flexible display panel 10 is non-overlapping with the bending area 11.

In S60, a mold frame 40 is made around the peripheral of the second electrode layer 32.

An orthographic projection of the mold frame 40 on the flexible display panel 10 is located within a range of an orthographic projection of the second electrode layer 32 on the flexible display panel 10.

In S70, the flexible display panel 10 is attached to the base layer 20.

The mold frame 40 is arranged around the outside of the first electrode layer 31, the first bonding electrode 36 is electrically connected to the third bonding electrode 38, and the orthographic projection of the second electrode layer 32 on the flexible display panel 10 covers the bending area 11.

In S80, a driver chip DC is mounted on a flexible circuit board FCB, and the flexible circuit board FCB is electrically connect to the second bonding electrode 37 and the third bonding electrode 38 respectively.

In the description of the specification, specific features, structures, materials or characteristics may be combined in any suitable manner in any one or more embodiments or examples.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display module, comprising:

a flexible display panel, including at least one bending area and at least two non-bending areas, and two adjacent non-bending areas being connected by a bending area;

a base layer, provided on a non-display side of the flexible display panel; and a sound wave driving structure, provided between the flexible display panel and the base layer, and including a first electrode layer and a second electrode layer, the first electrode layer being closer to the flexible display panel than the second electrode layer, and the first electrode layer and the second electrode layer having a gap therebetween;

wherein an orthographic projection of at least one of the first electrode layer and the second electrode layer on the flexible display panel is non-overlapping with the bending area; and/or the sound wave driving structure further includes an insulating spacing layer, and an orthographic projection of the insulating spacing layer on the flexible display panel is located in the bending area;

wherein the sound wave driving structure further includes:

a mold frame, arranged around a peripheral of the first electrode layer and the second electrode layer, and forming a vibration cavity with the flexible display panel and the base layer;

wherein in a case where the sound wave driving structure includes the insulating spacing layer, the insulating spacing layer is made of a same material as the mold frame and arranged in a same layer as the mold frame; and the insulating spacing layer separates the vibration cavity to form at least two sub-cavities.

2. The display module according to claim 1, wherein the first electrode layer includes at least two first electrodes, each first electrode is located in a non-bending area; and/or the second electrode layer includes at least two second electrodes, and each second electrode is located in a non-bending area.

3. The display module according to claim 2, wherein in a case where the first electrode layer includes the at least two first electrodes, the sound wave driving structure further includes a first connection line, and the first connection line is provided on the flexible display panel and electrically connected to the at least two first electrodes;

in a case where the second electrode layer includes the at least two second electrodes, the sound wave driving structure further includes a second connection line, the second connection line is provided on the base layer and electrically connected to the at least two second electrodes.

4. The display module according to claim 2, wherein in a case where the first electrode layer includes the at least two first electrodes, the sound wave driving structure further includes two first connection lines, the two first connection lines are respectively provided on both sides of the first electrode layer in a first direction, the first connection lines extend along a second direction and electrically connected to edges of the at least two first electrodes extending along the second direction; and the second direction is a direction in which the two adjacent non-bending areas are arranged, and the first direction is perpendicular to the second direction;

in a case where the second electrode layer includes the at least two second electrodes, the sound wave driving structure further includes two second connection lines, and the two second connection lines are respectively provided on both sides of the second electrode layer in the first direction, the second connection lines extend along the second direction and electrically connected to edges of the at least two second electrodes extending along the second direction.

5. The display module according to claim 2, wherein the sound wave driving structure further includes:

a first bonding electrode, provided on the flexible display panel, provided on a side of the first electrode layer in a second direction, and electrically connected to the first electrode layer; the second direction being a direction in which the two adjacent non-bending areas are arranged; and a second bonding electrode and a third bonding electrode, provided on the base layer and provided on a side of the second electrode layer in the second direction, wherein the second bonding electrode is electrically connected to the second electrode layer, and the third bonding electrode is electrically connected to the first bonding electrode.

6. The display module according to claim 5, wherein the sound wave driving structure further includes a first connection line, the first bonding electrode is electrically connected to the first electrode layer through the first connection line; and/or the sound wave driving structure further includes a second connection line, the second bonding electrode is electrically connected to the second electrode layer through the second connection line.

7. The display module according to claim 5, wherein the sound wave driving structure further includes two second connection lines, the sound wave driving structure includes two second bonding electrodes, and the two second bonding electrodes are respectively provided on both sides of the third bonding electrode in a first direction, and electrically connected to the two second connection lines respectively; and the first direction is perpendicular to the second direction.

8. The display module according to claim 1, wherein the sound wave driving structure further includes the insulating spacing layer;

in a case where an orthographic projection of each of the first electrode layer and the second electrode layer on the flexible display panel covers the bending area, a surface of the insulating spacing layer proximate to the flexible display panel is in contact with the first electrode layer, and a surface of the insulating spacing layer proximate to the base layer is in contact with the second electrode layer;

in a case where the orthographic projection of each of the first electrode layer and the second electrode layer on the flexible display panel is non-overlapping with the bending area, the surface of the insulating spacing layer proximate to the flexible display panel is flush with a surface of the first electrode layer proximate to the flexible display panel, and the surface of the insulating spacing layer proximate to the base layer is flush with a surface of the second electrode layer proximate to the flexible display panel;

in a case where an orthographic projection of the first electrode layer on the flexible display panel is non-overlapping with the bending area, and an orthographic projection of the second electrode layer on the flexible display panel covers the bending area, the surface of the insulating spacing layer proximate to the flexible display panel is flush with the surface of the first electrode layer proximate to the flexible display panel, and the surface of the insulating spacing layer proximate to the base layer is in contact with the second electrode layer;

in a case where the orthographic projection of the second electrode layer on the flexible display panel is non-overlapping with the bending area, and the orthographic projection of the first electrode layer on the flexible display panel covers the bending area, the surface of the insulating spacing layer proximate to the flexible display panel is in contact with the first electrode layer, and the surface of the insulating spacing layer proximate to the base layer is flush with the surface of the second electrode layer proximate to the flexible display panel.

9. The display module according to claim 1, wherein a surface of the mold frame proximate to the flexible display panel is flush with a surface of the insulating spacing layer proximate to the flexible display panel, and a surface of the mold frame proximate to the base layer is flush with a surface of the insulating spacing layer proximate to the base layer.

10. The display module according to claim 9, wherein in a case where a surface of the insulating spacing layer proximate to the flexible display panel is flush with a surface of the first electrode layer proximate to the flexible display panel, the mold frame is arranged around outside of the first electrode layer;

in a case where the surface of the insulating spacing layer proximate to the flexible display panel is in contact with the first electrode layer, an orthographic projection of the mold frame on the flexible display panel is located within a range of an orthographic projection of the first electrode layer on the flexible display panel, and the surface of the mold frame proximate to the flexible display panel is in contact with the first electrode layer;

in a case where a surface of the insulating spacing layer proximate to the base layer is flush with a surface of the second electrode layer proximate to the base layer, the mold frame is arranged around outside of the second electrode layer;

in a case where the surface of the insulating spacing layer proximate to the base layer is in contact with the second electrode layer, the orthographic projection of the mold frame on the flexible display panel is located within a range of an orthographic projection of the second electrode layer on the flexible display panel, and the surface of the mold frame proximate to the base layer is in contact with the second electrode layer.

11. The display module according to claim 1, wherein the mold frame includes a plurality of mold strips, and two adjacent mold strips have a first gap therebetween to enable the vibration cavity to communicate with outside environment.

12. The display module according to claim 11, wherein at a corner of the non-bending area away from the bending area, the two adjacent mold strips have the first gap therebetween; and one of the two adjacent mold strips includes a body portion and a first protruding portion; the body portion extends along the peripheral of the first electrode layer and the second electrode layer; one end of the first protruding portion is connected to the body portion, and an other end extends into the vibration cavity; and the first protruding portion is arranged opposite to the first gap.

13. The display module according to claim 12, wherein another of the two adjacent mold strips extends along the peripheral of the first electrode layer and the second electrode layer, and an extending direction of at least a part of the first protruding portion is parallel to an extending direction of the other mold strip.

14. The display module according to claim 1, wherein the sound wave driving structure includes the insulating spacing layer, wherein the insulating spacing layer includes an opening penetrating through the insulating spacing layer along a second direction, and the opening communicates the at least two sub-cavities on both sides of the insulating spacing layer; and the second direction is a direction in which the two adjacent non-bending areas are arranged.

15. The display module according to claim 14, wherein the insulating spacing layer includes a plurality of openings, and the plurality of openings cut off the insulating spacing layer to form a plurality of insulating blocks spaced apart along a first direction; and the first direction is perpendicular to the second direction.

16. The display module according to claim 14, wherein an orthographic projection of the mold frame on the flexible display panel is non-overlapping with the bending area, and the insulating spacing layer and the mold frame have a second gap therebetween; and the insulating spacing layer further includes a second protruding portion, and the second protruding portion is arranged opposite to the second gap.

17. The display module according to claim 1, wherein the base layer includes a buffer layer and a support layer stacked in a direction perpendicular to the flexible display panel and away from the flexible display panel;

the display module further comprises:

a back film, provided between the sound wave driving structure and the flexible display panel, the first electrode layer being provided on a surface of the back film, and the second electrode layer being provided on a surface of the buffer layer; or the back film being provided between the sound wave driving structure and the base layer, the first electrode layer being provided on the non-display side of the flexible display panel, and the second electrode layer being provided on the surface of the back film.

18. The display module according to claim 1, wherein the sound wave driving structure further includes:

a plurality of support columns, provided between the first electrode layer and the second electrode layer, and an orthographic projection of the plurality of support columns on the flexible display panel is non-overlapping with the bending area.

19. A display apparatus, comprising the display module according to claim 1.

\*   \*   \*   \*   \*